United States Patent
Tanzawa

(10) Patent No.: US 6,344,764 B2
(45) Date of Patent: Feb. 5, 2002

(54) SEMICONDUCTOR INTEGRATED CIRCUIT DEVICE

(75) Inventor: Toru Tanzawa, Ebina (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/404,220

(22) Filed: Sep. 23, 1999

(30) Foreign Application Priority Data

Nov. 16, 1998 (JP) .......................................... 10-325465

(51) Int. Cl.[7] ................................................. H03L 5/00
(52) U.S. Cl. ............................. 327/333; 326/68; 326/81
(58) Field of Search ............................ 327/55, 57, 333; 326/68, 80, 81, 83, 86, 117, 120, 121, 122

(56) References Cited

U.S. PATENT DOCUMENTS

| | | | | |
|---|---|---|---|---|
| 4,318,015 A | * | 3/1982 | Schade, Jr. .................. | 326/68 |
| 5,321,324 A | * | 6/1994 | Hardee et al. ................ | 326/62 |
| 5,363,338 A | * | 11/1994 | Oh ........................ | 365/230.06 |
| 5,418,477 A | * | 5/1995 | Dhong et al. ................. | 326/71 |
| 5,659,258 A | | 8/1997 | Tanabe et al. | |
| 5,781,026 A | * | 7/1998 | Chow .......................... | 326/26 |

OTHER PUBLICATIONS

Nobuaki Otsuka et al., IEEE Journal of Solid–State Circuits, vol. 32, No. 8, "Circuit Techniques for 1.5–V Power Supply Flash Memory", Aug. 1997, pp. 1217–1230.

* cited by examiner

Primary Examiner—Terry D. Cunningham
Assistant Examiner—Quan Tra
(74) Attorney, Agent, or Firm—Banner & Witcoff, Ltd.

(57) ABSTRACT

This invention discloses a level-shifting circuit for shifting the signal amplitude. This level-shifting circuit includes a p-channel transistor having a source for receiving a boosted potential, a p-channel transistor having a source for receiving the boosted potential, a gate connected to the drain of the transistor, and a drain connected to the gate of the transistor, and an n-channel transistor with a threshold voltage of about 0V having a drain connected to the drain of the transistor, a gate for receiving an output from an inverter, and a source for receiving an output from an inverter for inverting an output from the former inverter.

29 Claims, 13 Drawing Sheets

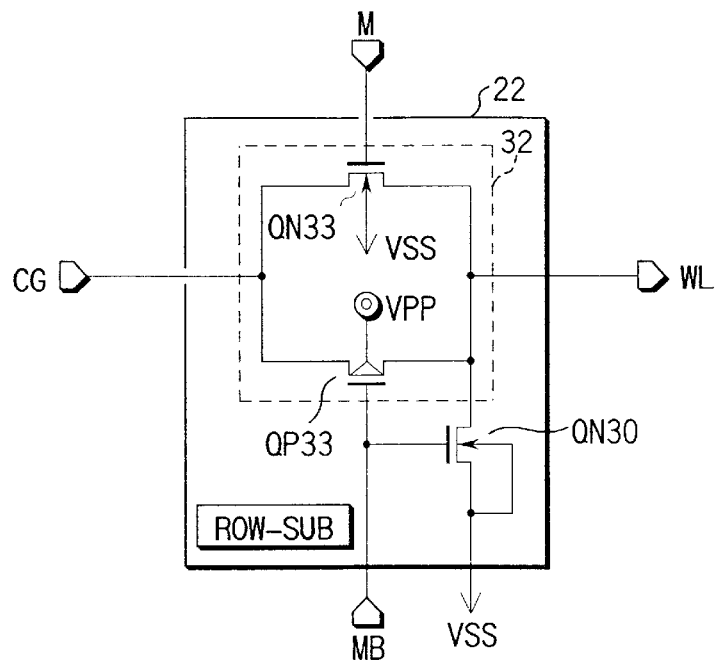
FIG. 14
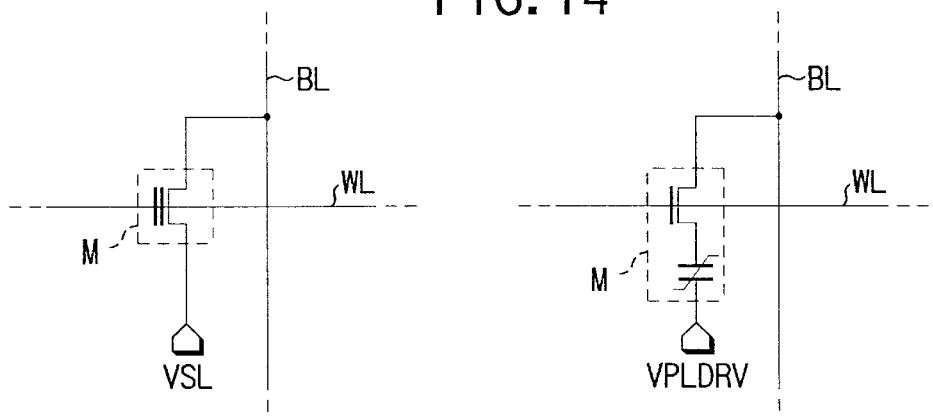
FLASH-CELL FIG. 15A
FRAM-CELL FIG. 15B
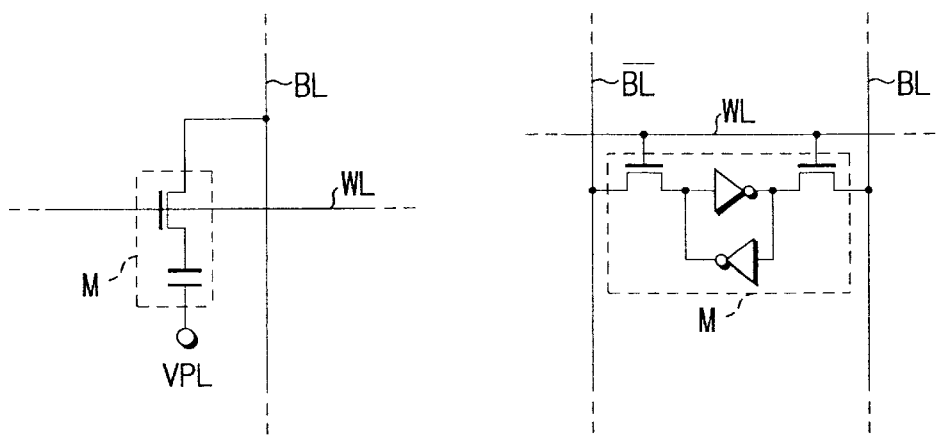
DRAM-CELL FIG. 15C
SRAM-CELL FIG. 15D

SEMICONDUCTOR INTEGRATED CIRCUIT DEVICE

BACKGROUND OF THE INVENTION

The present invention relates to a semiconductor integrated circuit device having a level-shifting circuit for shifting the signal amplitude.

In some semiconductor integrated circuit devices, a circuit using different voltages to input/output signals of different voltage levels is integrated in one chip. Such device incorporates a level-shifting circuit to shift, e.g., a power supply voltage level to another voltage level.

In semiconductor storage devices such as a DRAM, SRAM, and flash memory, many memory peripheral circuits use a power supply voltage to output a signal of the power supply voltage level. Of the memory peripheral circuits, e.g., a circuit for driving word lines uses a boosted voltage higher than the power supply voltage to output a signal of the boosted voltage level in order to accurately read out data of a memory cell. The level-shifting circuit shifts a signal of the power supply voltage level to a signal of the boosted voltage level.

Recently in the semiconductor storage device field, the power supply voltage is being reduced to reduce power consumption. However, the word line driving circuit must accurately read out data of a memory cell. Thus, the boosted voltage is more difficult to reduce than the power supply voltage, and the ratio of the power supply voltage to the boosted voltage is increasing. Owing to this trend, it is becoming difficult for the level-shifting circuit to output an input signal of the power supply voltage level as an output signal of the boosted voltage level.

FIG. 1A is a circuit diagram showing a conventional level-shifting circuit, and FIG. 1B is a waveform chart showing operation of this circuit.

The arrangement and operation of the level-shifting circuit will be described.

When an input signal IN101 changes from "L" level to "H" level at time T1 shown in FIG. 1B, a power supply potential VCC is input to the gate of an n-channel transistor QN102 to turn on the transistor QN102. Since the transistor QN102 is turned on, the potential of a node N102 drops to turn on a p-channel transistor QP1O1. At this time, a ground potential VSS is input to the gate of an n-channel transistor QN101, so the transistor QN101 is OFF. The potential of a node N101 changes to a boosted potential VPP to change an output signal OUT101 to "H" level. Since the potential of the node N101 changes to the boosted potential VPP, a p-channel transistor QP102 is turned off. Then, the potential of the node N102 changes to the ground potential VSS (note that the potential of the node N102 in the circuit shown in FIG. 1A is "VSS–VTH": VTH is the threshold voltage of the transistor QN102).

When the input signal IN101 changes from "H" level to "L" level at time T2, the power supply potential VCC is input to the gate of the transistor QN101 to turn on the transistor QN101. Since the transistor QN101 is turned on, the potential of the node N101 drops to turn on the transistor QP102. At this time, the ground potential VSS is input to the gate of the transistor QN102, so the transistor QN102 is OFF. The potential of the node N102 changes to the boosted potential VPP. Since the potential of the node N102 changes to the boosted potential VPP, the transistor QP101 is turned off. Then, the potential of the node N101 changes to the ground potential VSS (note that the potential of the node N101 in the circuit shown in FIG. 1A is "VSS–VTH": VTH is the threshold voltage of the transistor QN101). As a result, the output signal OUT101 changes to "L" level.

Note that the transistors QP101, QP102, QN101, and QN102 are of enhancement type in order to prevent a leakage current from flowing through each transistor when the input signal IN101 is at either "H" level or "L" level.

In the level-shifting circuit shown in FIG. 1A, to change the output signal OUT101 from "L" level to "H" level as the input signal IN101 changes from "L" level to "H" level, the drivability of the transistor QN102 must be set higher than that of the transistor QP102. If the drivability ratio of these transistors is small, both the transistors QN102 and QP102 stay ON, so a punch-through current flows from the boosted potential VPP to the ground potential VSS. That is, the level-shifting circuit malfunctions.

Under these circumstances, the drivabilities of the transistors QN101 and QN102 are conventionally set much higher than those of the transistors QP101 and QP102. However, a low power supply potential VCC decreases the current drivabilities of the transistors QN101 and QN102. To suppress the decrease in current drivability, the channel widths of the transistors QN101 and QN102 must be large.

To raise the switching speed, an inverter I102 for driving the transistor QN102 and an inverter I101 for driving the inverter I102 and transistor QN101 are large in size. However, this cannot avoid a long switching time Tr2 from "L" level to "H" level and a long switching time Tf2 from "H" level to "L" level shown in FIG. 1B, i.e., a low switching speed.

The switching speed varies more remarkably along with a decrease in power supply potential VCC. For example, the threshold voltage of a transistor varies due to manufacturing variations and the like. A low power supply potential VCC greatly influences the current amount flowing through the transistors QN101 and QN102 even with slight variations in threshold voltage. For this reason, the switching speed varies more remarkably along with a decrease in power supply potential VCC.

If the power supply potential VCC drops to values in the neighborhoods of the threshold voltages of the transistors QN101 and QN102, the level-shifting circuit shown in FIG. 1A cannot operate.

In the conventional level-shifting circuit, the switching speed decreases with a decrease in power supply voltage.

Further, if the power supply voltage drops to about the threshold voltage, the conventional level-shifting circuit cannot operate.

BRIEF SUMMARY OF THE INVENTION

The present invention has been made in consideration of the above situation, and has as its object to provide a semiconductor integrated circuit device having a level-shifting circuit capable of suppressing a decrease in switching speed even if the power supply potential drops, and capable of operating even if the power supply voltage drops to about the threshold voltage.

To achieve the above object, according to the present invention, there is provided a semiconductor integrated circuit device comprising a first transistor of a first conductivity type having a source for receiving a first potential, a second transistor of the first conductivity type having a source for receiving the first potential, a gate connected to a drain of the first transistor, and a drain connected to a gate of the first transistor, and a third transistor of a second conductivity type having a drain connected to the drain of the first transistor, a gate for receiving a first signal, and a source for receiving a second signal.

In the semiconductor integrated circuit device having the above arrangement, the second signal is input to the source of the third transistor without fixing the source potential. Thus, the third transistor can be turned off by the logic level of the second signal input to the source, unlike the prior art in which the third transistor is turned off by the logic level of the first signal input to the gate. This arrangement allows operation of the semiconductor integrated circuit device even if the threshold voltage of the third transistor is set lower than in the prior art.

Assuming that a level for turning on the third transistor among the logic levels of the first signal is equal to that in the prior art, the threshold voltage of the third transistor can be decreased to increase the current amount flowing through the third transistor. Since the current amount flowing through the third transistor can be increased, deterioration of the drivability can be suppressed even if the power supply potential drops. Therefore, even if the power supply potential drops, a decrease in switching speed can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 14 is a circuit diagram showing a circuit example of a sub-row decoder;

FIGS. 15A, 15B, 15C, and 15D are circuit diagrams each showing an equivalent circuit of a memory cell.

DETAILED DESCRIPTION OF THE INVENTION

Embodiments of the present invention will be described.
First Embodiment

Figure 2A:
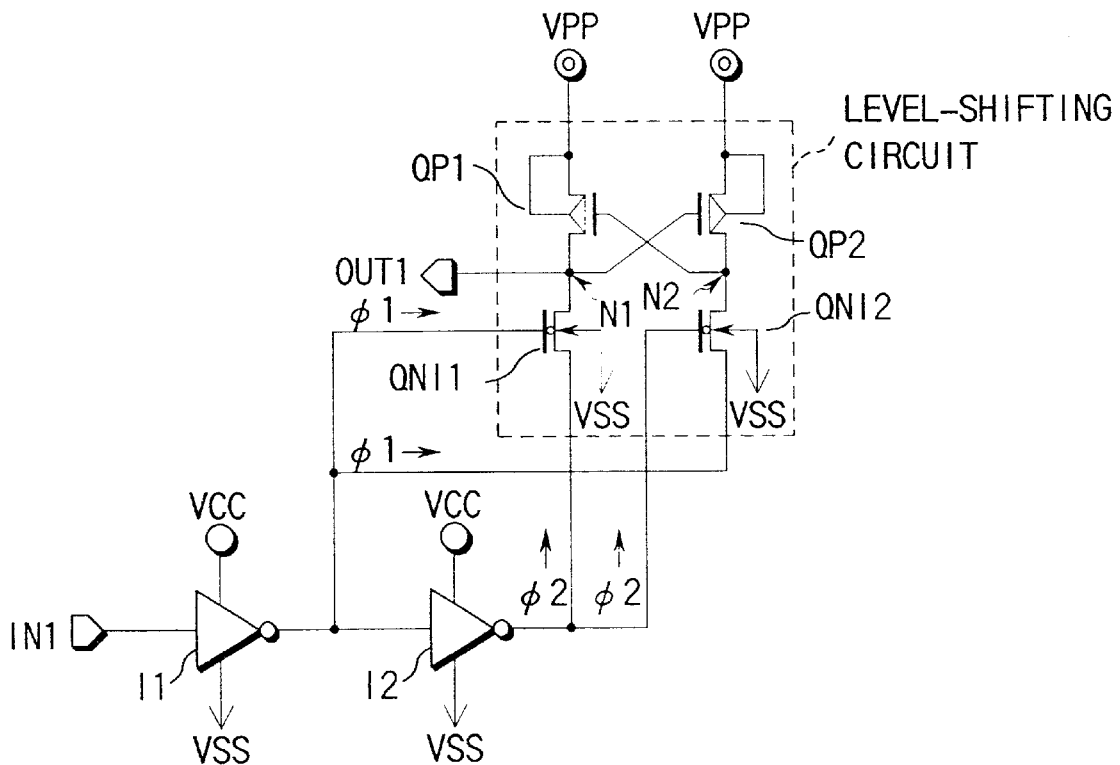
FIG. 2A is a circuit diagram showing a level-shifting circuit according to the first embodiment of the present invention.

FIG. 2A is a circuit diagram showing a level-shifting circuit according to the first embodiment of the present invention.

As shown in FIG. 2A, a boosted potential VPP is applied to the sources of p-channel transistors QP1 and QP2. The boosted potential VPP is obtained by boosting, e.g., a power supply potential VCC. The transistors QP1 and QP2 are of enhancement type. The gate of the transistor QP1 is connected to the drain of the transistor QP2, and the gate of the transistor QP2 is connected to the drain of the transistor QP1. The drain of the transistor QP1 is connected to that of an n-channel transistor QNI1, and the drain of the transistor QP2 is connected to that of an n-channel transistor QNI2.

The gate and source of the transistor QNI1 receive a signal ø1 output from an inverter I1, and a signal ø2 output from an inverter I2, respectively. The gate and source of the transistor QNI2 receive the signals ø2 and ø1, respectively.

The inverters I1 and I2 are driven by the potential difference between the power supply potential VCC and ground potential VSS (=0V). The inverter I1 receives an input signal IN1 having logic levels of the power supply potential VCC and ground potential VSS as "H" and "L" levels. The inverter I1 inverts the logic level of the input signal IN1 to output a signal ø1 having logic levels of the power supply potential VCC and ground potential VSS as "H" and "L" levels. The inverter I2 inverts the logic level of the signal ø1 to output a signal ø2 having logic levels of the power supply potential VCC and ground potential VSS as "H" and "L" levels.

In the first embodiment, an output signal from the level-shifting circuit is obtained from a node N1 between the drains of the transistors QP1 and QNI1. An output signal from the level-shifting circuit can be obtained from not only the node N1 but also a node N2 between the drains of the transistors QP2 and QNI2, and further from both the nodes N1 and N2. Note that the potential of the node N2 is inverted with respect to that of the node N1.

Figure 3A:
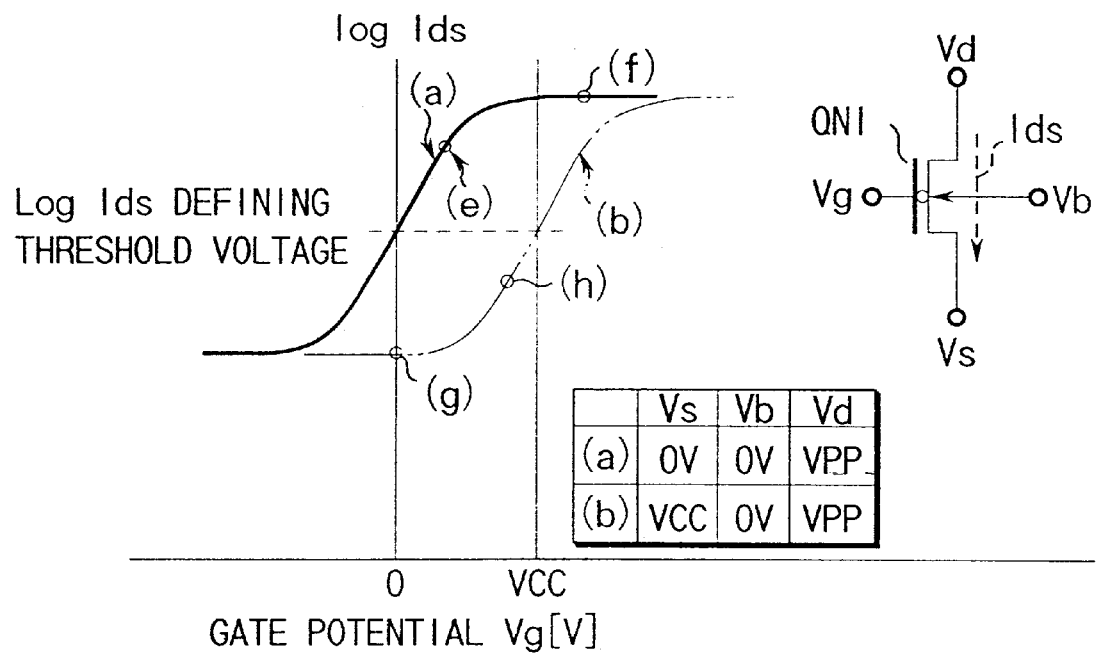
FIG. 3A is a graph showing the characteristics of a transistor QNI.

In the present invention, the threshold voltages of the transistors QNI1 and QNI2 are set much lower than those of the conventional transistors QN101 and QN102. Especially in the first embodiment, the threshold voltages of the transistors QNI1 and QNI2 are set to about 0V. The transistors QNI1 and QNI2 are formed on a p-type substrate or in a p-type well to which the ground potential VSS is applied. FIG. 3A shows the characteristics of the transistor QNI whose threshold voltage is set to about 0V.

For a source potential Vs=0V, a drain potential Vd=VPP, a substrate potential Vb=0V, and a gate potential Vg=0V, the transistor QNI flows a current Ids defining the threshold voltage in the drain-source path, as indicated by the characteristic curve (a) in FIG. 3A. That is, the transistor QNI is turned "on".

For a source potential Vs=VCC, a drain potential Vd=VPP, a substrate potential Vb=0V, and a gate potential Vg=0V, the characteristic curve (a) in FIG. 3A shifts to the characteristic curve (b), and the transistor QNI flows hardly any current Ids. That is, the transistor QNI is turned "off".

This operation will be explained.

Figure 2B:
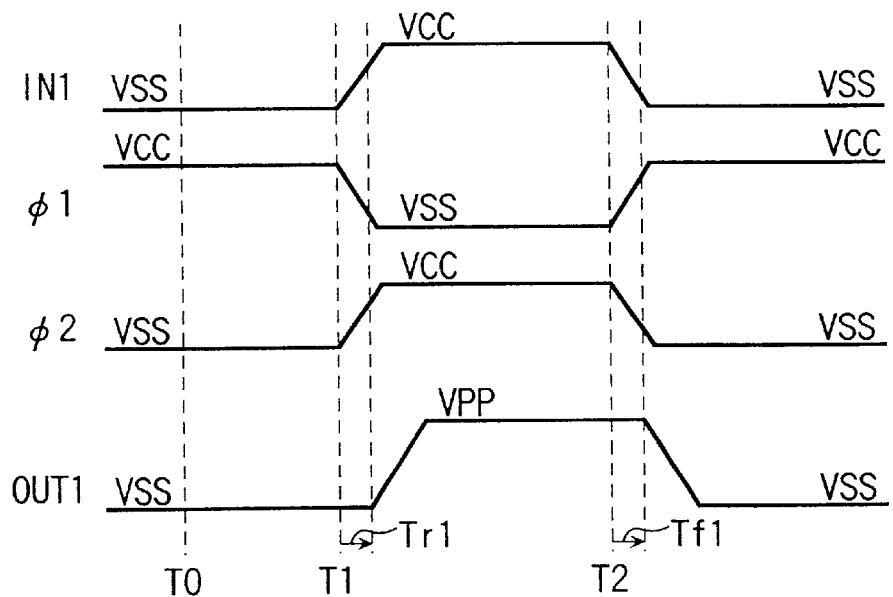
FIG. 2B is a waveform chart showing the operation of the level-shifting circuit according to the first embodiment of the present invention.

FIG. 2B is a waveform chart showing operation of the level-shifting circuit according to the first embodiment. Note that any signal delays in the inverters I1 and I2 are ignored in the waveform chart of FIG. 2B.

At time T0 shown in FIG. 2B, the input signal IN1 is at "L" level. Thus, the signals ø1 and ø2 are at "H" and "L" levels, respectively. In this state, the power supply potential VCC and ground potential VSS are respectively input to the gate and source of the transistor QNI1, and the transistor QNI1 is ON. The ground potential VSS and power supply potential VCC are respectively input to the gate and source of the transistor QNI2, and the transistor QNI2 is OFF.

When the input signal IN1 changes from "L" level to "H" level at time T1, the power supply potential VCC and ground potential VSS are respectively input to the gate and source of the transistor QNI2 to turn on the transistor QNI2. Since the transistor QNI2 is turned on, the potential of the node N2 drops to turn on the transistor QP1. At this time, the ground potential VSS and power supply potential VCC are respectively input to the gate and source of the transistor QNI1 to turn off the transistor QNI1. The potential of the node N1 changes to the boosted potential VPP to change an output signal OUT1 to "H" level. Since the potential of the node N1 changes to the boosted potential VPP, the transistor QP2 is turned off. Then, the potential of the node N2 changes to the ground potential VSS.

When the input signal IN1 changes from "H" level to "L" level at time T2, the power supply potential VCC and ground potential VSS are respectively input to the gate and source of the transistor QNI1 to turn on the transistor QNI1. Since the transistor QNI1 is turned on, the potential of the node N1 drops. Since the potential of the node N1 drops, the transistor QP2 is turned on. At this time, the ground potential VSS and power supply potential VCC are respectively input to the gate and source of the transistor QNI2, so the transistor QNI2 is OFF. The potential of the node N2 changes to the boosted potential VPP. Since the potential of the node N2 changes to the boosted potential VPP, the transistor QP1 is turned off. Then, the potential of the node N1 changes to the ground potential VSS to change the output signal OUT1 to "L" level.

Figure 3B:
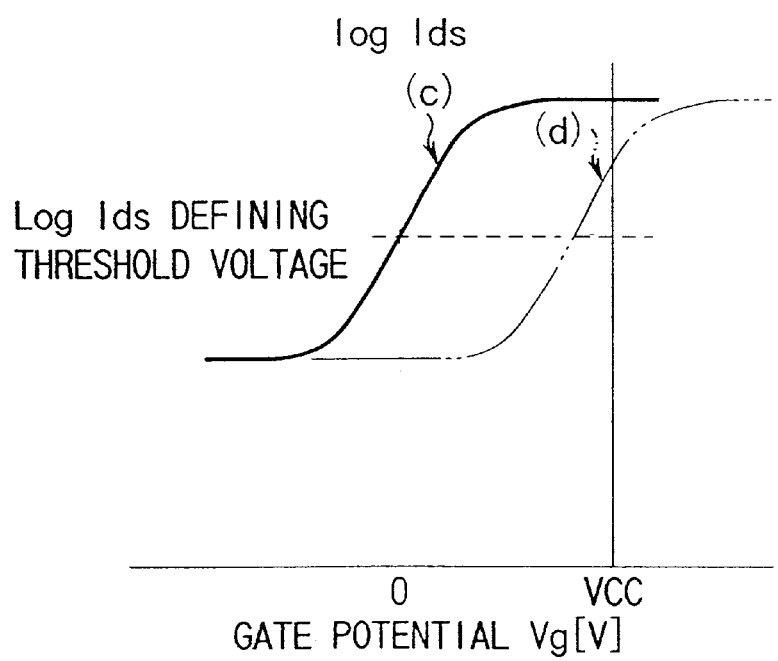
FIG. 3B is a graph for explaining the effects of the level-shifting circuit according to the present invention.

FIG. 3B is a graph for explaining the effects of the level-shifting circuit according to the present invention.

The characteristic curve (c) in FIG. 3B represents the relationship between the gate voltage Vg and the current Ids flowing in the drain-source path of the transistor QNI (corresponding to the transistors QNI1 and QNI2 of the level-shifting circuit according to the first embodiment) having a threshold of about 0V. The characteristic curve (d) represents the relationship between the gate voltage Vg and the current Ids flowing in the drain-source path of an enhancement type transistor QN (corresponding to the transistors QNI1 and QN102 of the conventional level-shifting circuit). The characteristic curves (c) and (d) are for a source potential Vs=0V, a drain potential Vd=VPP, and a substrate Vb=0V.

In the present invention, the threshold voltages of the transistors QNI1 and QNI2 are set much lower than those of the transistors QN101 and QN102. with this setting, when the power supply potential VCC is applied to the gate, the transistors QNI1 and QNI2 can flow a larger current Ids than the transistors QN101 and QN102, as indicated by the characteristic curve (c). This state is equivalent to a high current drivability. As is apparent from the characteristic curve (c), the current drivability is maintained high even upon a decrease in power supply potential VCC. Since the current drivabilities of the transistors QNI1 and QNI2 can be enhanced, the level-shifting circuit of the first embodiment can suppress a decrease in switching speed even upon a decrease in power supply potential VCC, compared to the conventional level-shifting circuit.

In the level-shifting circuit according to the first embodiment, when the potential changes from "L" level to "H" level and from "H" level to "L" level, a transistor to be turned on and a transistor to be turned off are only exchanged, as explained earlier with reference to FIG. 2B. This switching operation is basically the same as switching operation of the conventional level-shifting circuit.

Figure 1A:
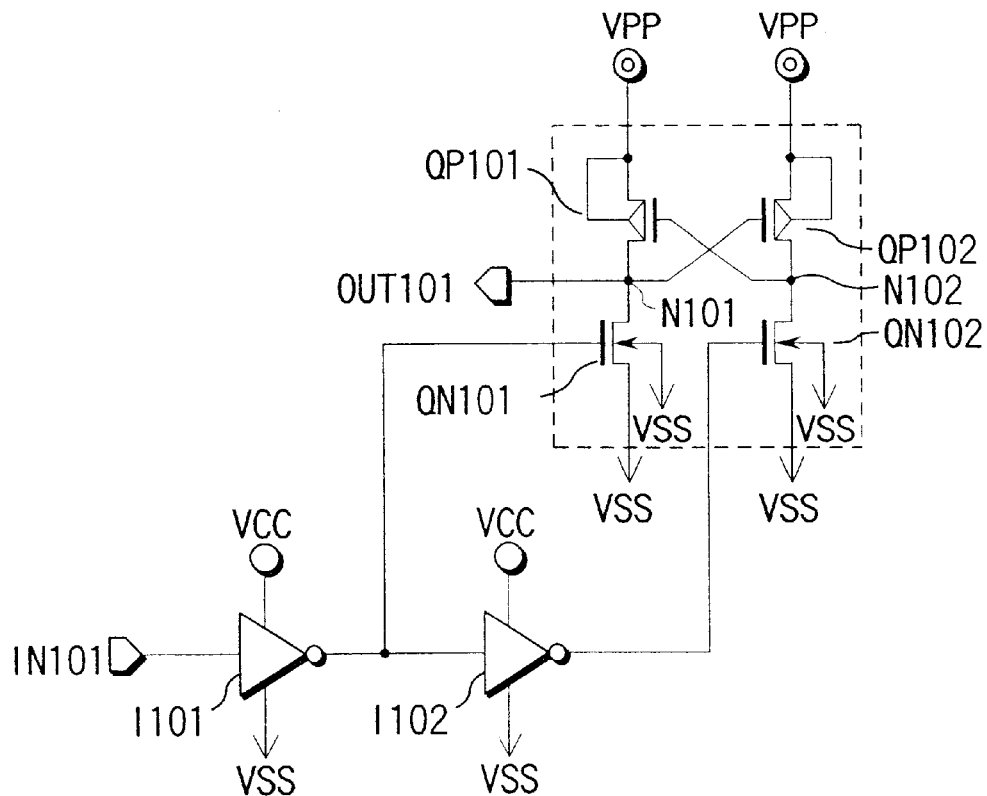
FIG. 1A is a circuit diagram showing a conventional level-shifting circuit.
Figure 1B:
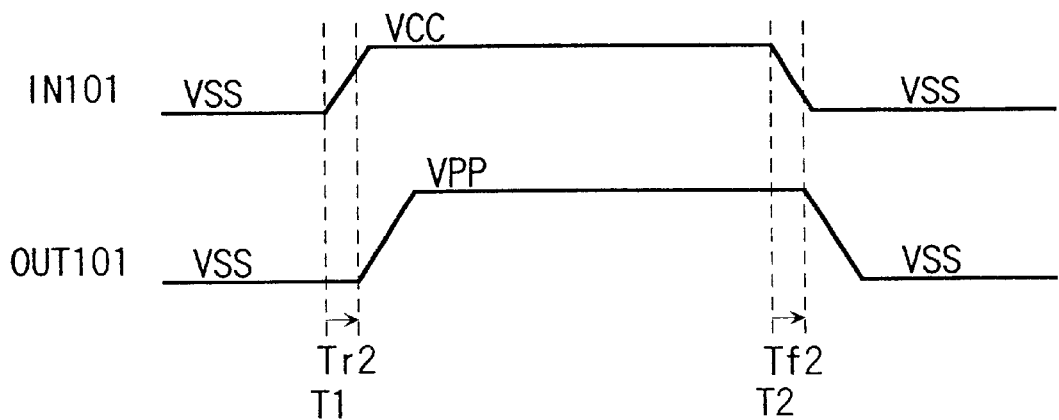
FIG. 1B is a waveform chart showing the operation of the conventional level-shifting circuit.

In the first embodiment, when the power supply potential VCC is set equal to that in the conventional level-shifting circuit, the current drivabilities of the transistors QNI1 and QNI2 are much higher than those of the transistors QN11 and QN102. The switching time Tr1 from "L" level to "H" level shown in FIG. 2B becomes shorter than the conventional switching time Tr2 shown in FIG. 1B. Also, the switching time Tf1 from "H" level to "L" level becomes shorter than the conventional switching time Tf2.

In the first embodiment, the threshold voltages of the transistors QNI1 and QNI2 are decreased to, e.g., about 0V. Even if the power supply potential VCC drops to values in the neighborhoods of the threshold voltages of the transistors QN101 and QN102, the level-shifting circuit can operate.

In the conventional level-shifting circuit, the transistors QN101 and QN102 may be replaced by the transistors QNI1 and QNI2. In this case, the transistors QNI1 and QNI2 flow a larger leakage current. This is because the transistors QNI1 and QNI2 flow a current Ids even upon applying the ground potential VSS (=0V) to their gates, as indicated by the characteristic curve (c).

To the contrary, in the level-shifting circuit according to the first embodiment, when the ground potential VSS is applied to the gates of the transistors QNI1 and QNI2, the power supply potential VCC is applied to their sources. This makes the transistors QNI1 and QNI2 flow hardly any current Ids, i.e., cut off, as indicated by the characteristic curve (b) in FIG. 3A. Since the transistors QNI1 and QNI2 can be cut off, the transistors QNI1 and QNI2 flow hardly any leakage current.

Second Embodiment

The second embodiment generalizes the level-shifting circuit of the present invention.

Figure 4A:
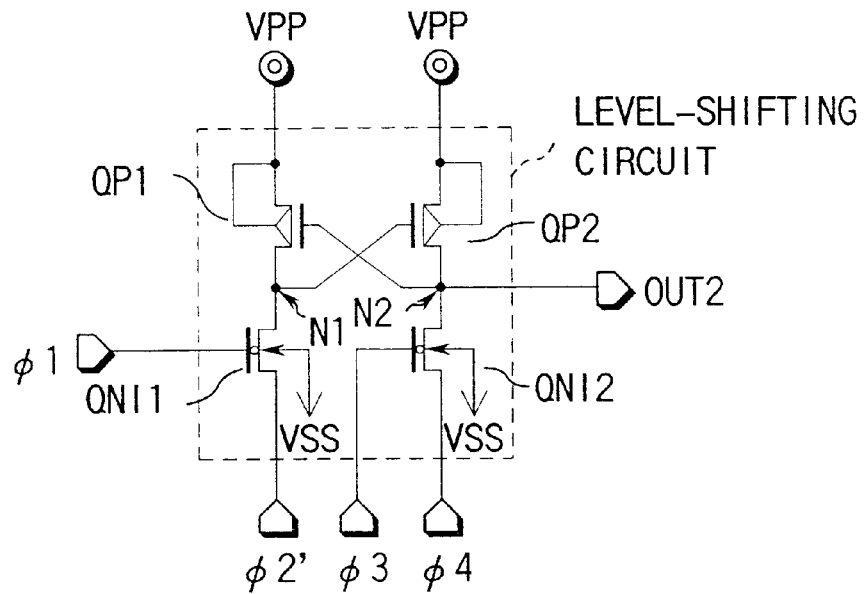
FIG. 4A is a circuit diagram showing a level-shifting circuit according to the second embodiment of the present invention.

FIG. 4A is a circuit diagram showing a level-shifting circuit according to the second embodiment of the present invention.

In FIG. 4A, the same reference numerals as in FIG. 2A denote the same parts.

In FIG. 4A, input signals ø1 and ø3 are inverted with respect to each other, and so are input signals ø2' and ø4.

Operation of this level-shifting circuit will be explained.

Figure 4B:
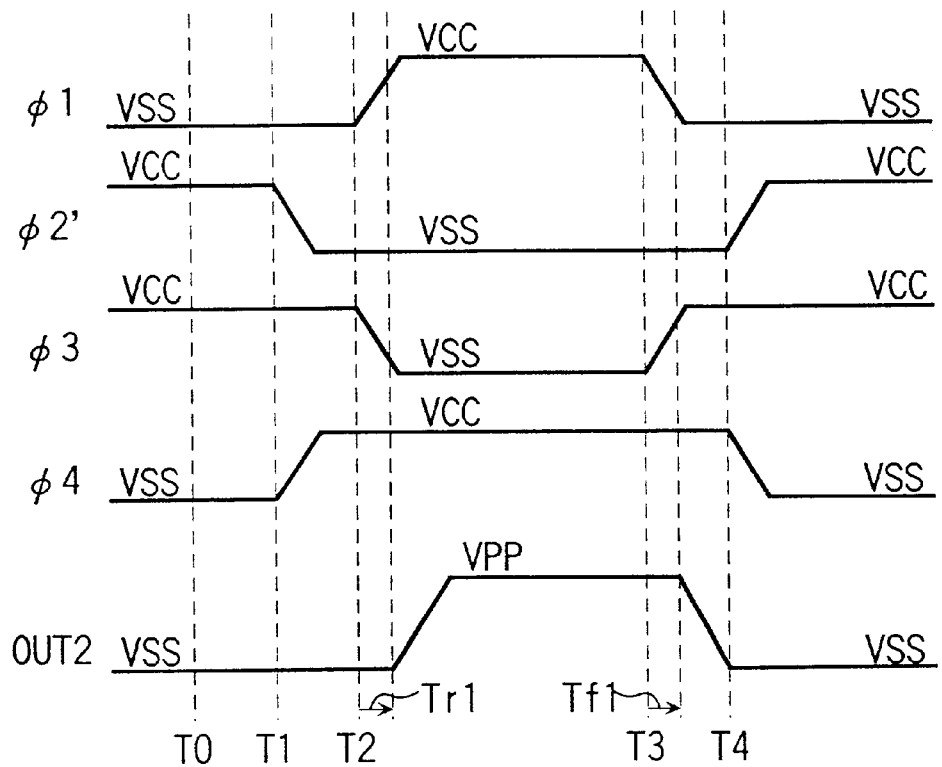
FIG. 4B is a waveform chart showing the operation of the level-shifting circuit according to the second embodiment of the present invention.

FIG. 4B is a waveform chart showing the operation of the level-shifting circuit according to the second embodiment.

At time T0 shown in FIG. 4B, the signals ø1, ø2', ø3, and ø4 are at "L", "H", "H", and "L" levels, respectively. In this state, a ground potential VSS and power supply potential VCC are respectively input to the gate and source of a transistor QNI1, so the transistor QNI1 is OFF. The power supply potential VCC and ground potential VSS are respectively input to the gate and source of a transistor QNI2, so the transistor QNI2 is ON.

When the signal ø2' changes from "H" level to "L" level and the signal ø4 changes from "L" level to "H" level at time T1, the ground potential VSS and power supply potential VCC are respectively input to the gate and source of the transistor QNI2 to turn off the transistor QNI2.

When the signal ø1 changes from "L" level to "H" level and the signal ø3 changes from "H" level to "L" level at time T2, the power supply potential VCC and ground potential VSS are respectively input to the gate and source of the transistor QNI1 to turn on the transistor QNI1.

Since the transistors QNI2 and QNI1 are respectively turned off and on, the potential of a node N2 changes to a boosted potential VPP to change an output signal OUT2 to "H" level.

When the signal ø1 changes from "H" level to "L" level and the signal ø3 changes from "L" level to "H" level at time T3, the ground potential VSS and power supply potential VCC are respectively input to the gate and source of the transistor QNI1 to turn off the transistor QNI1.

When the signal ø2' changes from "L" level to "H" level and the signal ø4 changes from "H" level to "L" level at time T4, the power supply potential VCC and ground potential VSS are respectively input to the gate and source of the transistor QNI2 to turn on the transistor QNI2.

Since the transistors QNI1 and QNI2 are respectively turned off and on, the potential of the node N2 changes to the ground potential VSS to change the output signal OUT2 to "L" level.

As described above, the second embodiment is different from the first embodiment in that the times T1 and T3 at which the n-channel transistor is turned off are set earlier than the times T2 and T4 at which the n-channel transistor is turned on. In the first embodiment, the time at which the n-channel transistor is turned off is the same as the time at which the n-channel transistor is turned on.

The second embodiment can also attain the same effects as in the first embodiment. In addition, the times T1 and T3 at which the n-channel transistor is turned off are set earlier than the times T2 and T4 at which the n-channel transistor is turned on. Accordingly, the second embodiment can reduce any punch-through current that flows from the boosted potential VPP to the ground potential VSS. The second embodiment can suppress power consumption, and can suppress particularly the consumption amount of boosted potential VPP.

Third Embodiment

Figure 5A:
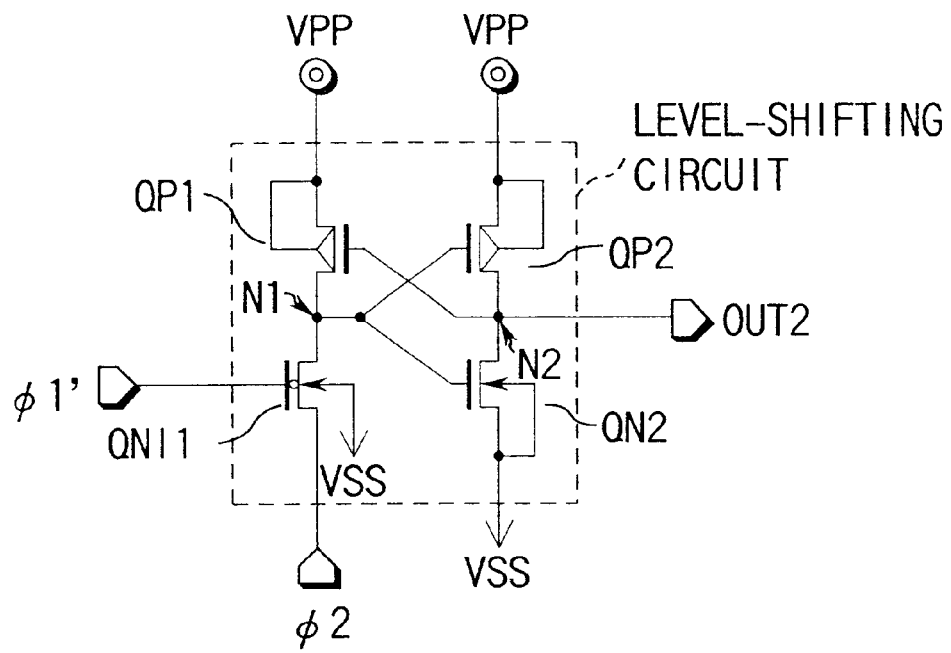
FIG. 5A is a circuit diagram showing a level-shifting circuit according to the third embodiment of the present invention.

FIG. 5A is a circuit diagram showing a level-shifting circuit according to the third embodiment of the present invention. In FIG. 5A, the same reference numerals as in FIG. 2A denote the same parts.

As shown in FIG. 5A, input signals ø1' and ø2 are inverted with respect to each other except for the rise of the signal ø2.

The third embodiment adopts an n-channel transistor QN2 in place of the transistor QNI2. The source of the transistor QN2 receives a ground potential VSS. The gate and drain of the transistor QN2 are connected to the drains of transistors QP1 and QP2, respectively. The transistor QN2 is of enhancement type.

Operation of this level-shifting circuit will be described.

Figure 5B:
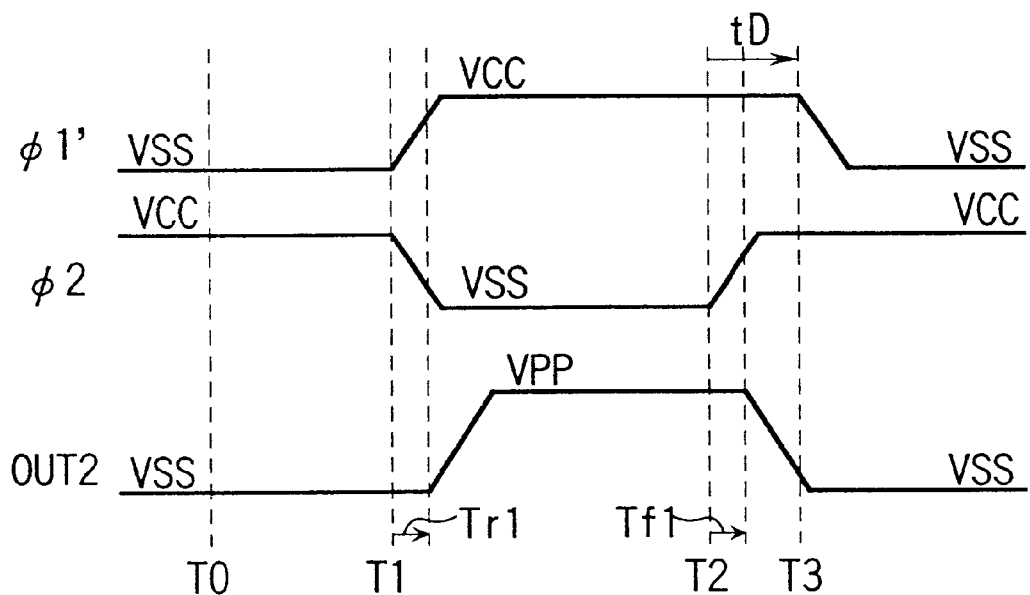
FIG. 5B is a waveform chart showing the operation of the level-shifting circuit according to the third embodiment of the present invention.

FIG. 5B is a waveform chart showing operation of the level-shifting circuit according to the third embodiment.

At time T0 shown in FIG. 5B, the signals ø1' and ø2 are at "L" and "H" levels, respectively. In this state, the ground potential VSS and power supply potential VCC are respectively input to the gate and source of a transistor QNI1, so the transistor QNI1 is OFF. A boosted potential VPP is input to the gate of the transistor QN2 via a node N1, so the transistor QN2 is ON.

When the signal ø1' changes from "L" level to "H" level and the signal ø2 changes from "H" level to "L" level at time T1, the power supply potential VCC and ground potential VSS are respectively input to the gate and source of the transistor QNI1 to turn on the transistor QNI1. Since the transistor QNI1 is turned on, the potential of the node N1 drops to turn on and off the transistors QP2 and QN2, respectively. The potential of a node N2 changes to the boosted potential VPP to change an output signal OUT2 to "H" level. Since the potential of the node N2 changes to the boosted potential VPP, the transistor QP2 is turned off. The potential of the node N1 changes to the ground potential VSS.

When the signal ø2 changes from "L" level to "H" level at time T2, the power supply potential VCC is input to the gate and source of the transistor QNI1. In this state, the transistor QNI1 having a threshold voltage of about 0V is ON. While the transistor QP1 is OFF, the node N1 is charged from the source of the transistor QNI1. As a result, the potential of the node N1 starts rising.

When the potential of the node N1 exceeds the threshold voltage of the transistor QN2 at time T3 after a delay time tD, the transistors QN2 and QP1 are turned on. When the signal ø1' changes from "H" level to "L" level at time T3, the ground potential VSS is input to the gate of the transistor QNI1 to completely turn off the transistor QNI1 (cut off). While leakage of the boosted potential VPP via the transistor QNI1 is suppressed, the potential of the node N1 changes to the boosted potential VPP. The potential of the node N2 changes to the ground potential VSS–VTH to change the output signal OUT2 to "L" level.

The third embodiment can also attain the same effects as in the first embodiment.

By charging the node N1 by the transistor QNI1 in an initial state, the consumption amount of boosted potential VPP can be reduced.

Since the transistor QNI1 is turned off, when the potential of the node N1 exceeds the threshold voltage of the transistor QN2, any punch-through current that flows from the boosted potential VPP to the ground potential VSS can be reduced. Consequently, the third embodiment can suppress power consumption, and can suppress particularly the consumption amount of boosted potential VPP.

Note that a delay time tD within which the potential of the node N1 can be changed to "H" level (e.g., the threshold voltage of the transistor QN2) by the transistor QNI1 suffices.

Fourth Embodiment

Figure 6:
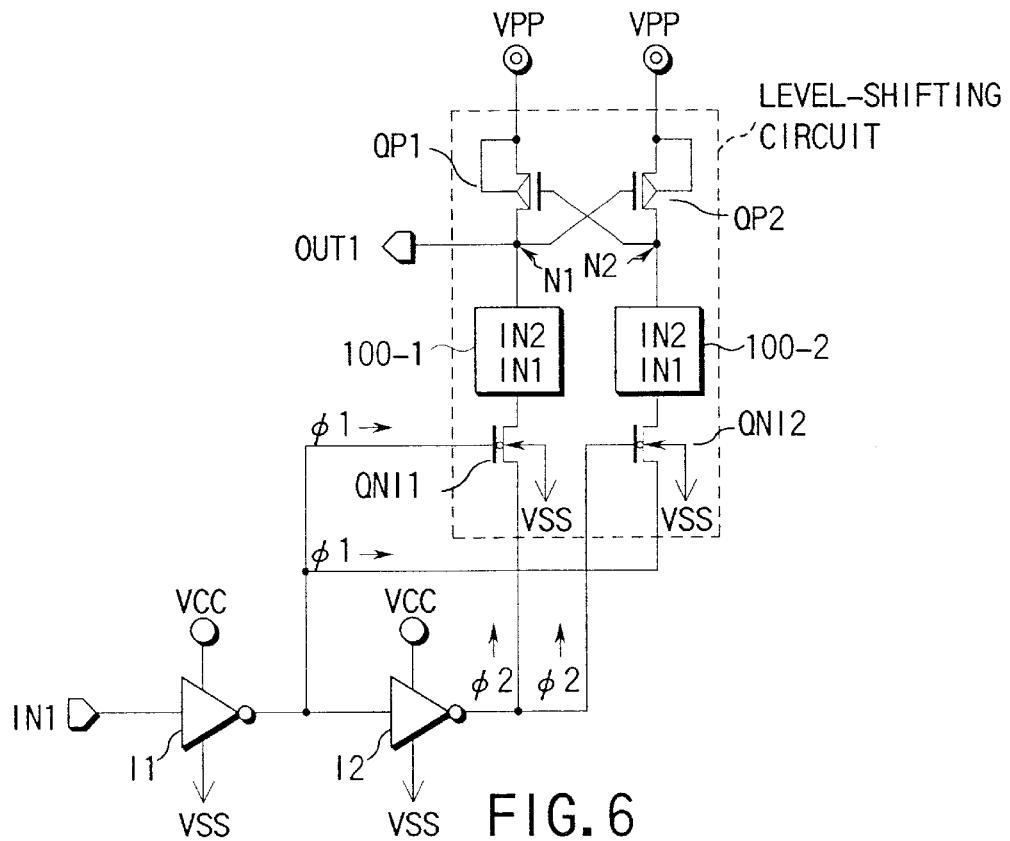
FIG. 6 is a circuit diagram showing a level-shifting circuit according to the fourth embodiment of the present invention.

FIG. 6 is a circuit diagram showing a level-shifting circuit according to the fourth embodiment of the present invention. In FIG. 6, the same reference numerals as in FIG. 2A denote the same parts.

The fourth embodiment is different from the first embodiment in that the drain of a transistor QP1 is connected to that of a transistor QNI1 via a transfer gate 100-1, and the drain of a transistor QP2 is connected to that of a transistor QNI2 via a transfer gate 100-2. The transfer gates 100-1 and 100-2 function to increase the snapback breakdown voltages of the transistors QNI1 and QNI2. FIGS. 7A to 7E show several circuit examples of the transfer gate 100.

FIGS. 7A to 7E are circuit diagrams, respectively, showing the first to fifth circuit examples of the transfer gate 100.

Figure 7A:
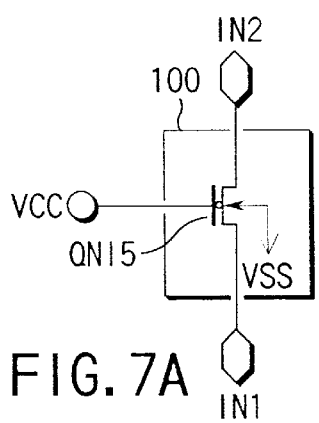
FIGS. 7A, 7B, 7C, 7D, and 7E are circuit diagrams each showing a circuit example of a transfer gate.

In the first circuit example, as shown in FIG. 7A, the transfer gate 100 is made from an n-channel transistor QNI5 having a drain connected to the drain of the transistor QP1 (or QP2), and a source connected to the drain of the transistor QNI1 (or QNI2). The gate of the transistor QNI5 receives a power supply potential VCC. The threshold voltage of the transistor QNI5 is equal to the threshold voltages of the transistors QNI1 and QNI2, and set to approximately 0V in the first circuit example.

Figure 7B:
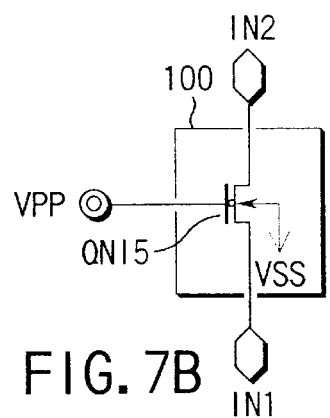

In the second circuit example, as shown in FIG. 7B, a boosted potential VPP is input to the gate of the transistor QNI5 in the first circuit example instead of the power supply potential VCC.

Figure 7C:
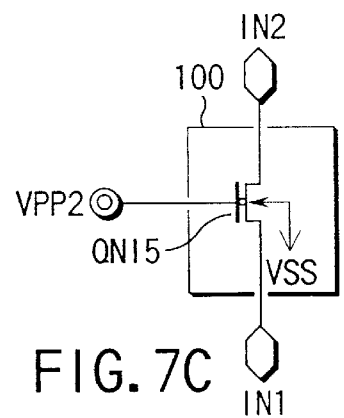

In the third circuit example, as shown in FIG. 7C, a boosted potential VPP2 is input to the gate of the transistor QNI5 in the first circuit example instead of the boosted potential VPP. The boosted potential VPP2 is lower than the boosted potential VPP serving as "H" level of an output signal OUT1, and is higher than the power supply potential VCC.

Figure 7D:
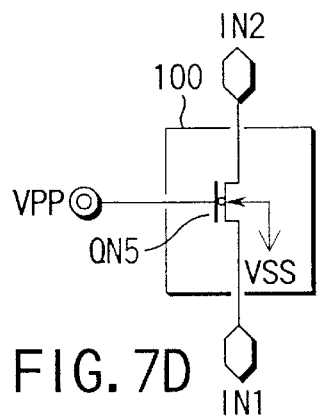

In the fourth circuit example, as shown in FIG. 7D, the transistor QNI5 in the second circuit example is replaced by an enhancement type n-channel transistor QN5. The threshold voltage of the transistor QN5 is higher than the threshold voltages of the transistors QNI1 and QNI2.

Figure 7E:
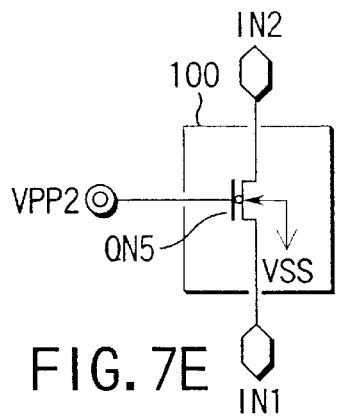

In the fifth circuit example, as shown in FIG. 7E, the transistor QNI5 in the third circuit example is replaced by the transistor QN5 having a high threshold voltage.

The fourth embodiment can attain the same effects as in the first embodiment. At the same time, the fourth embodiment can increase the snapback breakdown voltages of the transistors QNI1 and QNI2, which is advantageous when the boosted potential VPP is high or the ratio of the boosted potential VPP to the power supply potential VCC is high.

Note that the operation of the level-shifting circuit according to the fourth embodiment is the same as that of the level-shifting circuit according to the first embodiment.

The transfer gates 100-1 and 100-2 can be assembled in the second embodiment.

Fifth Embodiment

Figure 8:
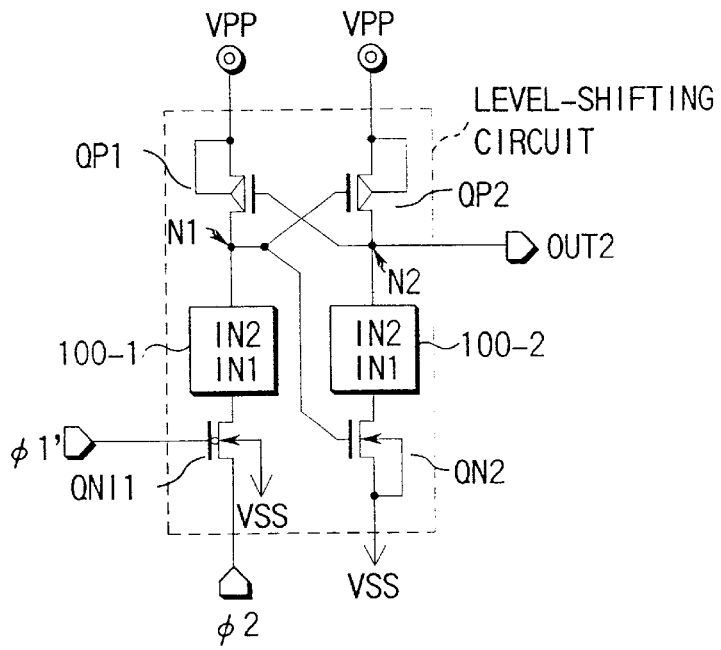
FIG. 8 is a circuit diagram showing a level-shifting circuit according to the fifth embodiment of the present invention.

FIG. 8 is a circuit diagram showing a level-shifting circuit according to the fifth embodiment of the present invention. In FIG. 8, the same reference numerals as in FIG. 5A denote the same parts.

The fifth embodiment is different from the third embodiment in that the drain of a transistor QP1 is connected to that of a transistor QNI1 via a transfer gate 100-1, and the drain of a transistor QP2 is connected to that of a transistor QN2 via a transfer gate 100-2. As the transfer gates 100-1 and 100-2, the circuits shown in FIGS. 7A to 7E can be used.

The fifth embodiment can attain the same effects as in the third embodiment. At the same time, the fifth embodiment can increase the snapback breakdown voltages of the transistors QNI1 and QN2, which is advantageous when the boosted potential VPP is high or the ratio of the boosted potential VPP to the power supply potential VCC is high.

Note that the operation of the level-shifting circuit according to the fifth embodiment is the same as that of the level-shifting circuit according to the third embodiment.

Sixth Embodiment

Figure 9:
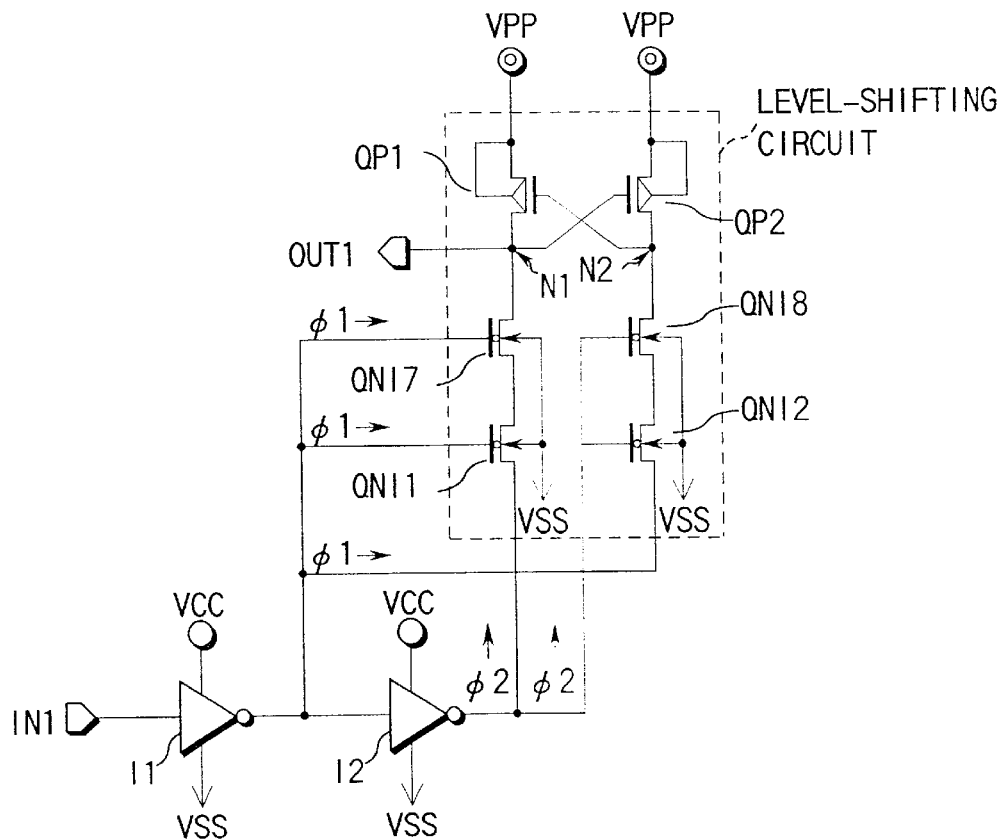
FIG. 9 is a circuit diagram showing a level-shifting circuit according to the sixth embodiment of the present invention.

FIG. 9 is a circuit diagram showing a level-shifting circuit according to the sixth embodiment of the present invention. In FIG. 9, the same reference numerals as in FIG. 2A denote the same parts.

The sixth embodiment is different from the first embodiment in that the sixth embodiments adopts an n-channel transistor QNI7 having a drain connected to the drain of a transistor QP1 and a source connected to the drain of a transistor QNI1, and an n-channel transistor QNI8 having a drain connected to the drain of a transistor QP2 and a source connected to the drain of a transistor QNI2. The gate of the transistor QNI7 receives a signal ø1 similarly to the transistor QNI1, and the gate of the transistor QNI8 receives a signal ø2 similarly to the transistor QNI2. The transistors QNI7 and QNI8 function to increase the snapback breakdown voltages of the transistors QNI1 and QNI2, similar to the above-described transistor QNI5.

The sixth embodiment can attain the same effects as in the first embodiment. Further, similar to the fourth embodiment, the sixth embodiment can increase the snapback breakdown voltages of the transistors QNI1 and QNI2, which is advantageous when a boosted potential VPP is high or the ratio of the boosted potential VPP to a power supply potential VCC is high.

Note that the operation of the level-shifting circuit according to the sixth embodiment is the same as that of the level-shifting circuit according to the first embodiment.

The transistors QNI7 and QNI8 can be assembled in the second embodiment. The transistor QNI7 can be assembled in the third embodiment.

Seventh Embodiment

The first to sixth embodiments have exemplified the level-shifting circuit of shifting the logic level of a signal from the power supply potential VCC to the boosted potential VPP.

The present invention can also be applied to a level-shifting circuit of shifting the logic level of a signal from the ground potential VSS to a negative potential VBB.

The seventh embodiment concerns an example of the level-shifting circuit of shifting the logic level of a signal from the ground potential VSS to the negative potential VBB.

Figure 10A:
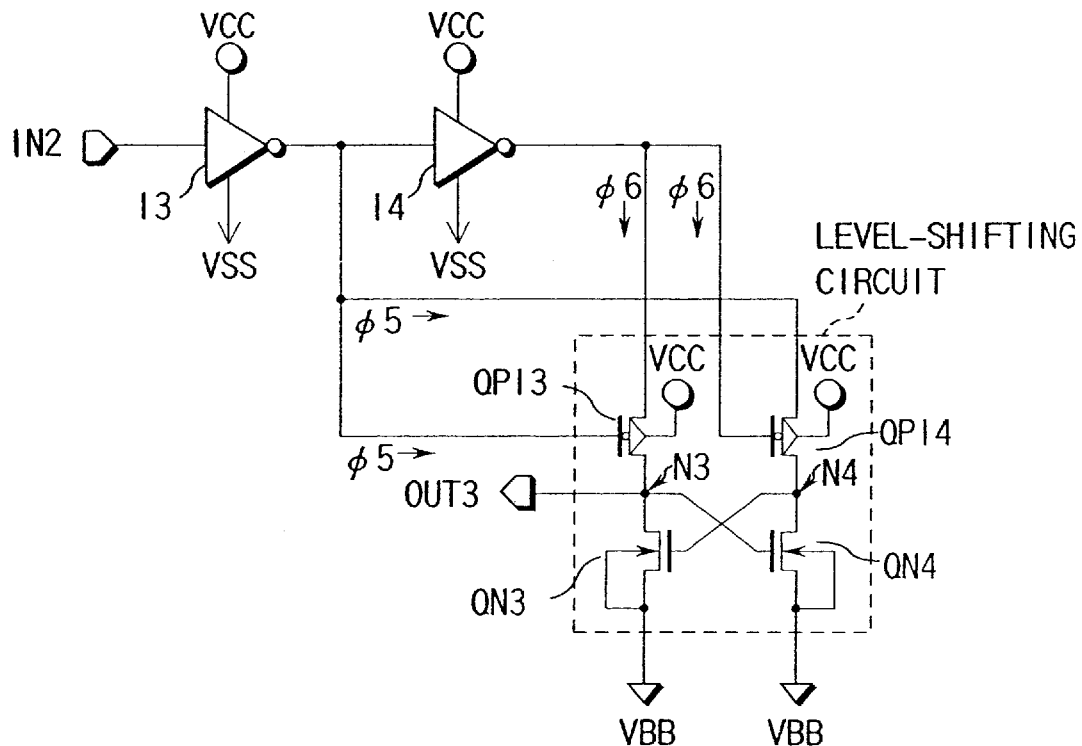
FIG. 10A is a circuit diagram showing a level-shifting circuit according to the seventh embodiment of the present invention.

FIG. 10A is a circuit diagram showing a level-shifting circuit according to the seventh embodiment of the present invention.

As shown in FIG. 10A, the negative potential VBB is applied to the sources of n-channel transistors QN3 and QN4. The transistors QN3 and QN4 are of enhancement type. The gate of the transistor QN3 is connected to the drain of the transistor QN4, and the gate of the transistor QN4 is connected to the drain of the transistor QN3. The drain of the transistor QN3 is connected to that of a p-channel transistor QPI3, and the drain of the transistor QN4 is connected to that of a p-channel transistor QPI4.

The gate and source of the transistor QPI3 receive a signal ø5 output from an inverter I3, and a signal ø6 output from an inverter I4, respectively. The gate and source of the transistor QPI4 receive the signals ø6 and ø5, respectively.

The inverters I3 and I4 are driven by the potential difference between a power supply potential VCC and ground potential VSS (=0V). The inverter I3 receives an input signal IN2 having logic levels of the power supply potential VCC and ground potential VSS as "H" and "L" levels. The inverter I3 inverts the logic level of the input signal IN2 to output a signal ø5 having logic levels of the power supply potential VCC and ground potential VSS as "H" and "L" levels. The inverter I4 inverts the logic level of the signal ø5 to output a signal ø6 having logic levels of the power supply potential VCC and ground potential VSS as "H" and "L" levels.

The transistors QPI3 and QPI4 have low threshold voltages. The transistors QPI3 and QPI4 are formed on an n-type substrate or in an n-type well to which the power supply potential VCC is applied.

In the seventh embodiment, an output signal from the level-shifting circuit is obtained from a node N3 between the drains of the transistors QN3 and QPI3. An output signal from the level-shifting circuit can be obtained from not only the node N3 but also a node N4 between the drains of the transistors QN4 and QPI4, and further from both the nodes N3 and N4. Note that the potential of the node N4 is inverted with respect to that of the node N3.

Figure 10B:
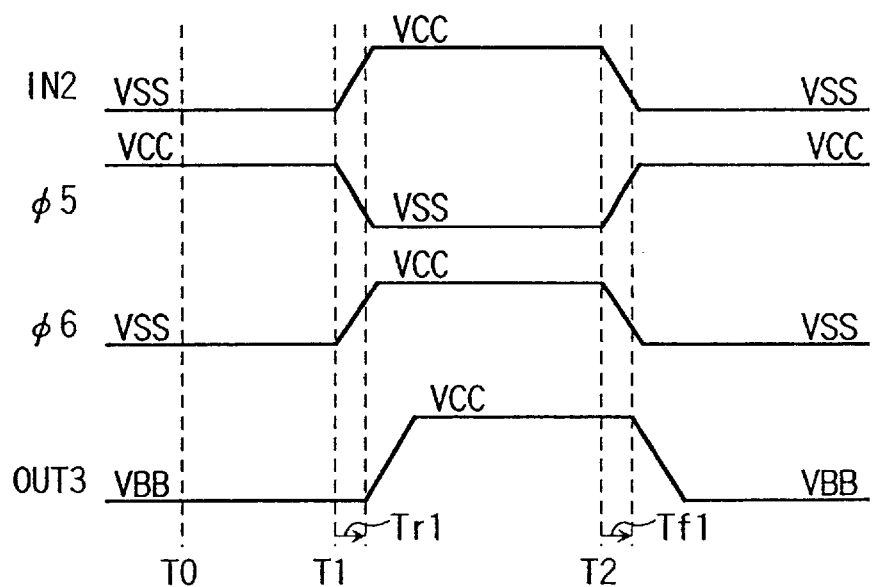
FIG. 10B is a waveform chart showing the operation of the level-shifting circuit according to the seventh embodiment of the present invention.

FIG. 10B is a waveform chart showing the operation of the level-shifting circuit according to the seventh embodiment. Note that any signal delays in the inverters I3 and I4 are ignored in the waveform chart of FIG. 10B.

At time T0 shown in FIG. 10B, the input signal IN2 is at "L" level. Thus, the signals ø5 and ø6 are at "H" and "L" levels, respectively. In this state, the power supply potential VCC and ground potential VSS are respectively input to the gate and source of the transistor QPI3, so the transistor QPI3 is OFF. The ground potential VSS and power supply potential VCC are respectively input to the gate and source of the transistor QPI4, so the transistor QPI4 is ON. The node N3 is at the negative potential VBB, and thus an output signal OUT3 is at "L" level.

When an input signal IN3 changes from "L" level to "H" level at time T1, the ground potential VSS and power supply potential VCC are respectively input to the gate and source of the transistor QPI3 to turn on the transistor QPI3. Since the transistor QPI3 is turned on, the potential of the node N3 rises to turn on the transistor QN4. At this time, the power supply potential VCC and ground potential VSS are respectively input to the gate and source of the transistor QPI4 to turn off the transistor QPI4. The potential of the node N4 changes to the negative potential VBB to turn off the transistor QN3. The potential of the node N3 changes to the power supply potential VCC to change the output signal OUT3 to "H" level.

When the input signal IN2 changes from "H" level to "L" level at time T2, the ground potential VSS and power supply potential VCC are respectively input to the gate and source of the transistor QPI4 to turn on the transistor QPI4. Since the transistor QPI4 is turned on, the potential of the node N4 rises. Since the potential of the node N4 rises, the transistor QN3 is turned on. At this time, the power supply potential VCC and ground potential VSS are respectively input to the gate and source of the transistor QPI3 to turn off the transistor QPI3. The potential of the node N3 changes to the negative potential VBB to change the output signal OUT3 to "L" level. Since the potential of the node N3 changes to the negative potential VBB, the transistor QN4 is turned off. Then, the potential of the node N4 changes to the power supply potential VCC.

The seventh embodiment can shift "L" level out of signal logic levels from the ground potential VSS to the negative potential VBB, while maintaining the same effects as in the first embodiment.

Similar to the seventh embodiment, the second to sixth embodiments can shift "L" signal level from the ground potential VSS to the negative potential VBB without impairing their effects by inverting the conductivity type of the transistor and replacing the boosted potential VPP with the negative potential VBB.

Eighth Embodiment

Figure 11:
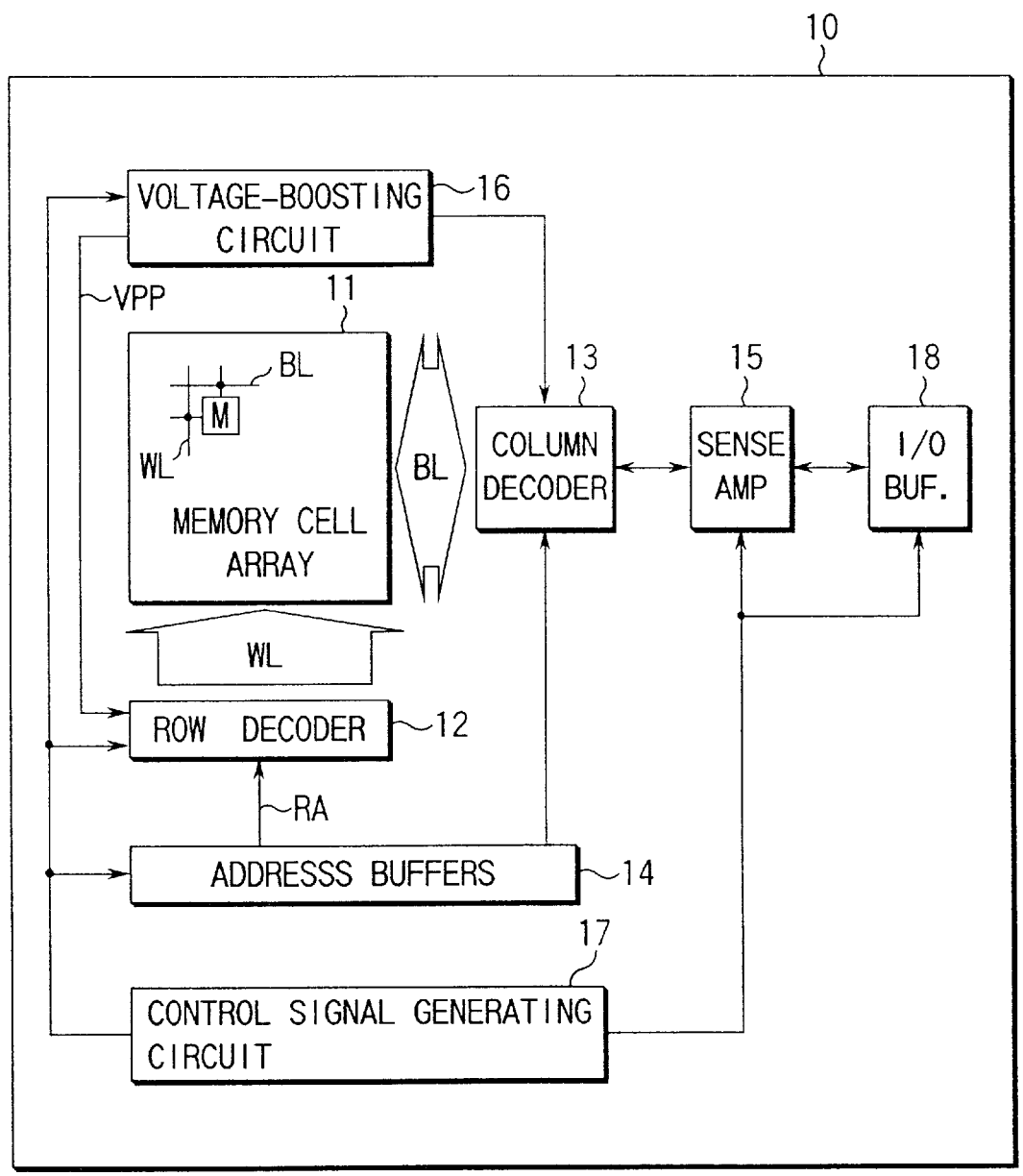
FIG. 11 is a block diagram showing the basic arrangement of a semiconductor storage device according to the eighth embodiment of the present invention.

FIG. 11 is a block diagram showing the basic arrangement of a semiconductor storage device according to the eighth embodiment of the present invention.

As shown in FIG. 11, a semiconductor storage device 10 comprises a memory cell array 11. The memory cell array 11 has a matrix of memory cells M. The semiconductor storage device 10 basically comprises, as circuit blocks for reading out and writing data from and in the memory cells M, a row decoder 12, column decoder 13, address buffer 14, sense amplifier 15, voltage-boosting circuit 16, and I/O buffer 18. A control signal generating circuit 17 generates a control signal for controlling the operation timing of each circuit block. The address buffer 14 buffers an input address to output a row address RA and column address CA. The row address RA is input to the row decoder 12, whereas the column address CA is input to the column decoder 13. The row decoder 12 decodes the row address RA to select a word line WL based on the decoding result. The column decoder 13 decodes the column address CA to select a bit line BL based on the decoding result. The voltage-boosting circuit 16 outputs a word line boosted potential VPP higher than a power supply potential VCC.

In a data read, the sense amplifier 15 amplifies the readout data of a memory cell M via the selected bit line BL. The I/O buffer 18 outputs the data amplified by the sense amplifier 15 outside the semiconductor storage device 10.

In a data write, the I/O buffer 18 outputs to the sense amplifier 15 data input externally from the semiconductor storage device 10. The sense amplifier 15 writes the data input via the I/O buffer 18 in a memory cell M via the selected bit line BL.

Figure 12:
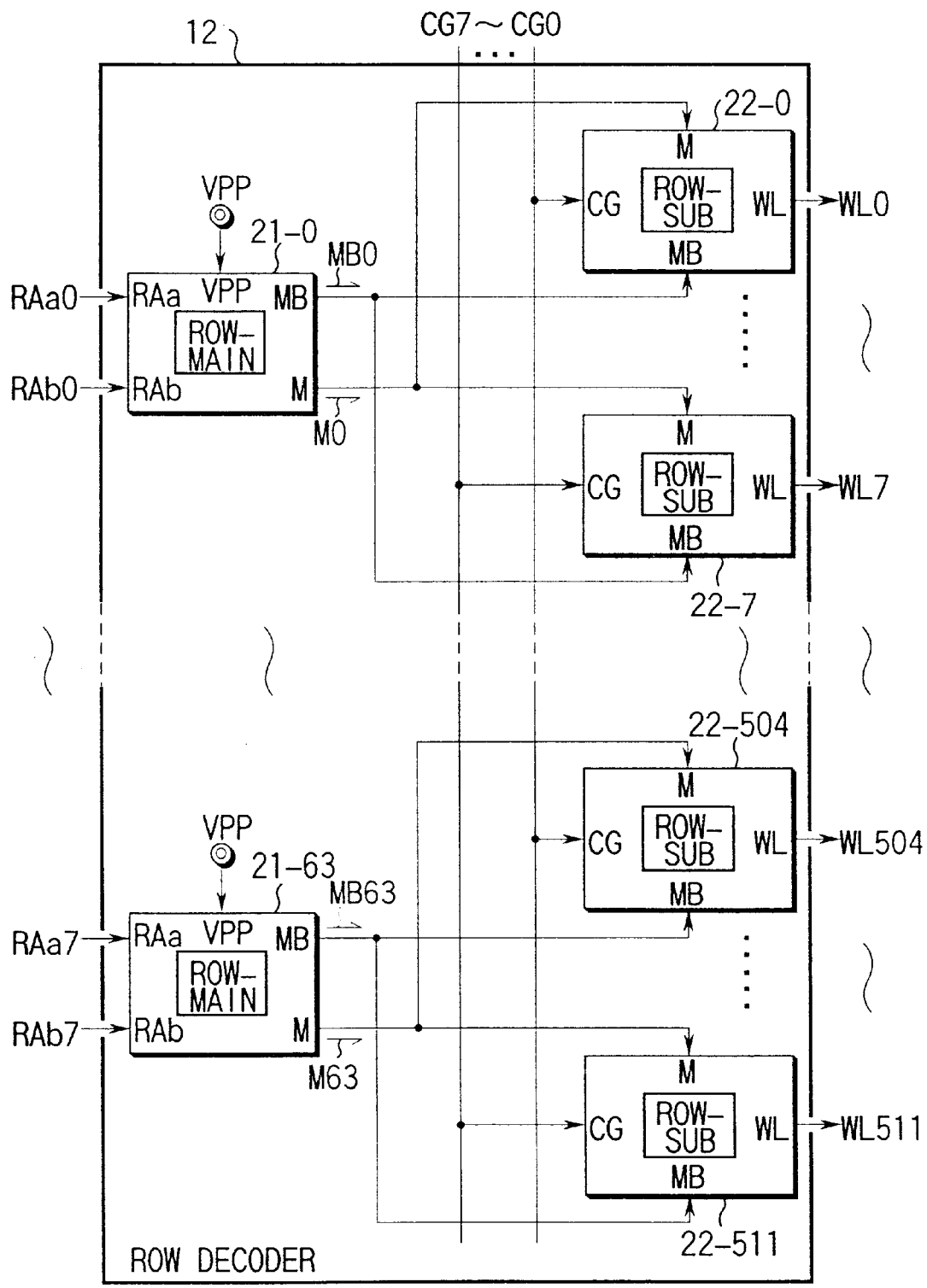
FIG. 12 is a block diagram showing an arrangement example of a row decoder.

FIG. 12 is a block diagram showing an arrangement example of the row decoder.

Figure 13:
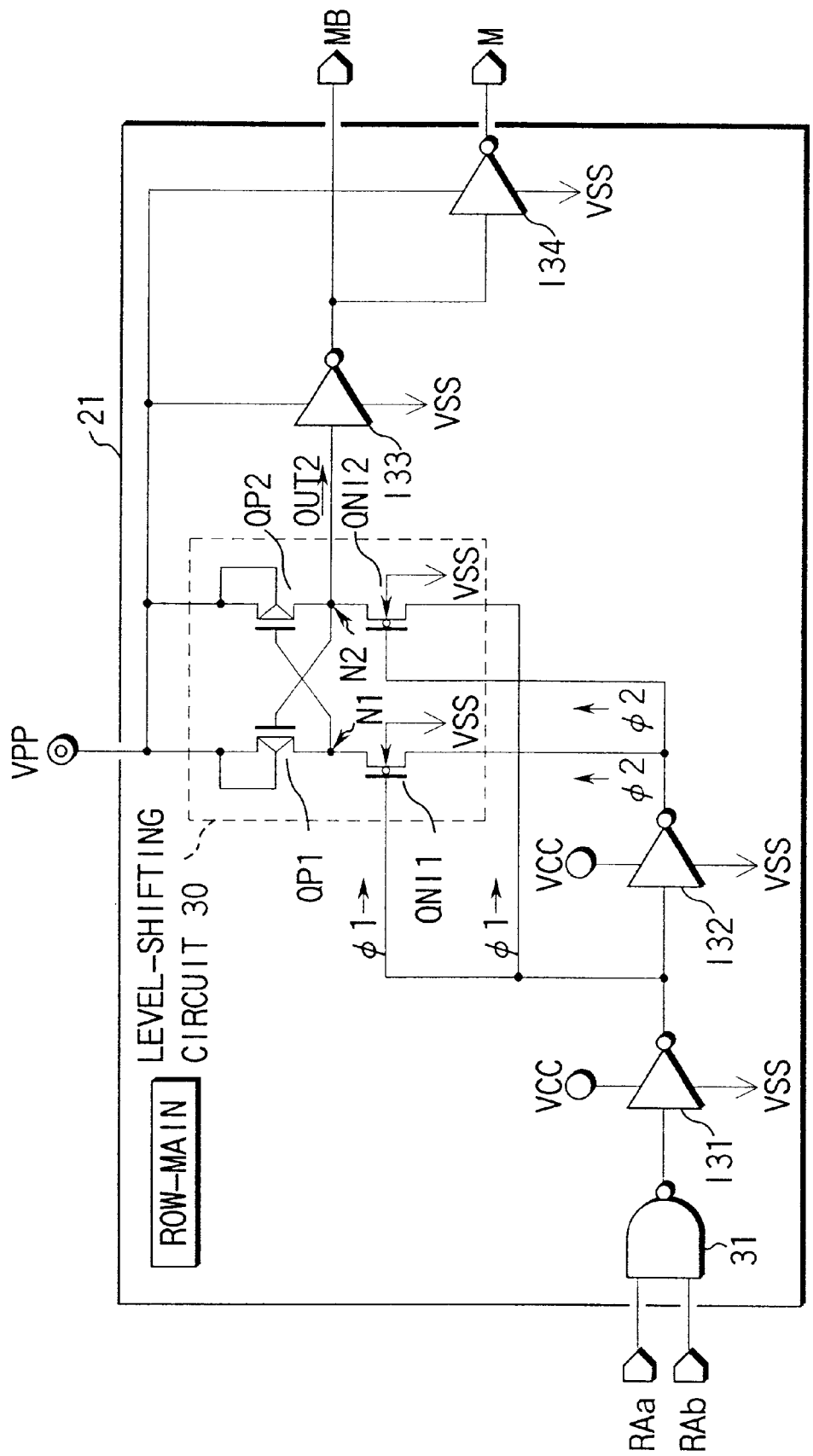
FIG. 13 is a circuit diagram showing a circuit example of a main row decoder.

As shown in FIG. 12, this arrangement example of the row decoder 12 selects one of 512 word lines WL0 to WL511. The row decoder 12 is made up of 64 main row decoders (ROW-MAIN) 21-0 to 21-63, and 512 sub-row decoders (ROW-SUB) 22-0 to 22-511. FIG. 13 shows a circuit example of the main row decoder 21.

FIG. 13 is a circuit diagram showing a circuit example of the main row decoder. The circuit example shown in FIG. 13 is common to the main row decoders 21-0 to 21-63 shown in FIG. 12.

As shown in FIG. 13, the main row decoder 21 according to this circuit example comprises a NAND circuit 31 for receiving row addresses RAa and RAb, an inverter I31 for receiving an output from the NAND circuit 31, an inverter I32 for receiving an output from the inverter I31, a level-shifting circuit 30 for shifting the logic level of the output from the inverter I31, and inverters I33 and I34 for receiving an output from the level-shifting circuit 30 and outputting complementary main decoded signals M and MB. The inverters I33 and I34 are driven by the potential difference between the boosted potential VPP and ground potential VSS (=0V). The complementary main decoded signals M and MB are input to the sub-row decoder 22. FIG. 14 shows a circuit example of the sub-row decoder 22.

FIG. 14 is a circuit diagram showing a circuit example of the sub-row decoder. The circuit example shown in FIG. 14 is common to the sub-row decoders 22-0 to 22-511 shown in FIG. 12.

As shown in FIG. 14, the sub-row decoder 22 according to this circuit example comprises a CMOS transfer gate circuit 32 for transferring a word line driving signal CG to the word line WL in accordance with the complementary main decoded signals M and MB, and an n-channel transistor QN30 for supplying the ground potential VSS (=0V) to the word line WL when the main decoded signal MB is at "H" level. The transfer gate circuit 32 is made up of an n-channel transistor QN33 having a gate for receiving the main decoded signal M and a current path series-connected between the supply terminal of the word line driving signal CG and the word line WL, and a p-channel transistor QP33 having a gate for receiving the main decoded signal MB and a current path series-connected between the supply terminal of the word line driving signal CG and the word line WL.

For example, when the word line WL7 is to be selected, the row decoder 12 changes RAa0 and RAb0 among row addresses RAa0 to RAa7 and RAb0 to RAb7 to "H" level (=power supply potential VCC), and changes all the remaining row addresses RAa1 to RAa7 and RAb1 to RAb7 to "L" level (=ground potential VSS). The row decoder 12 changes CG7 among word line driving signals CG0 to CG7 to "HH" level (=boosted potential VPP), and changes all the remaining word line driving signals CG0 to CG6 to "L" level (=ground potential VSS). Of the word lines WL0 to WL511, only the word line WL7 changes to the boosted potential VPP via the transfer gate circuit 32. All the remaining word lines WL0 to WL6 and WL8 to WL511 change to the ground potential VSS via the transistor QN30. In this manner, one of the 512 word lines WL0 to WL511 can be selected.

In the row decoder 12, any level-shifting circuit according to the present invention can be used for the level-shifting circuit 30 of the main row decoder 21. The eighth embodiment exemplifies an example of using the level-shifting circuit according to the first embodiment for the level-shifting circuit 30.

More specifically, as shown in FIG. 13, the inverters I31 and I32 are driven by the potential difference between the power supply potential VCC and ground potential VSS (=0V). Therefore, an output from the inverter I31 corresponds to the signal ø1 in the first embodiment, and an output from the inverter I32 corresponds to the signal ø2 in the first embodiment.

The level-shifting circuit 30 of the eighth embodiment obtains an output signal OUT2 from a node N2 between transistors QP2 and QNI2. The signal waveform of the output signal OUT2 corresponds to that of the signal ø1 out of the signals ø1 and ø2. The level-shifting circuit 30 shifts "H" level out of the logic levels of the signal ø1 from the power supply potential VCC to the boosted potential VPP.

The level-shifting circuit according to the present invention can be used for, e.g., the row decoder 12 of the semiconductor storage device 10, like the eighth embodiment.

The eighth embodiment has exemplified an example of using the level-shifting circuit according to the first embodiment for the level-shifting circuit 30 of the row decoder 12. Alternatively, the level-shifting circuit 30 can use the level-shifting circuit according to any one of the second to sixth embodiments.

The semiconductor storage device 10 can be either a nonvolatile or volatile memory, and the present invention can be applied to both nonvolatile and volatile memories. That is, the memory cell M of the memory cell array 11 can be either the one used for a nonvolatile memory or the one used for a volatile memory. FIGS. 15A to 15D show several examples of the memory cell M of the memory cell array 11.

FIGS. 15A to 15D are circuit diagrams each showing an equivalent circuit of the memory cell.

FIG. 15A shows a flash-cell used in a nonvolatile memory, FIG. 15B shows an FRAM-cell used in a nonvolatile memory, FIG. 15C shows a DRAM-cell used in a volatile memory, and FIG. 15D shows an SRAM-cell used in a volatile memory.

The memory cells shown in FIGS. 15A to 15D can be used for the memory cell M.

The level-shifting circuit according to the present invention has been exemplified by the first to eighth embodiments. However, the level-shifting circuit according to the present invention is not limited to the first to eighth embodiments, and can be variously modified within the spirit and scope of the present invention.

For example, the boosted potential VPP is higher than "H" level of the signal ø1 or the like, i.e., the power supply potential VCC, but need not always be kept high so long as the boosted potential VPP at times becomes higher than the power supply potential VCC during operation of the integrated circuit.

Similarly, the negative potential VBB is lower than "L" level of the signal ø5 or the like, i.e., the ground potential VSS, but need not always be kept low so long as the negative potential VBB at times becomes lower than the ground potential VSS during operation of the integrated circuit.

When the drain potentials Vd of the transistor QNI1 and QNI2 are set to the boosted potential VPP, and the substrate potential Vb is set to the ground potential VSS, the gate potential Vg and source potential Vs take four combinations (1) to (4) in terms of circuit operation:

(1) Vg=VSS, Vs=VSS (2) Vg=VCC, Vs=VCC (3) Vg=VCC, Vs=VSS (4) Vg=VSS, Vs=VCC

Of combinations (1) to (4), the transistors QNI1 and QNI2 are turned on in combinations (1) to (3), and the transistors QNI1 and QNI2 are turned off in only combination (4).

In combinations (1) to (3), the transistors QNI1 and QNI2 may either be weakly or strongly inverted. In the weakly inverted state, the current Ids is not saturated, as indicated by the point (e) shown in FIG. 3A. In the strongly inverted state, the current Ids is saturated, as indicated by the point (f) shown in FIG. 3A.

In combination (4), the transistors QNI1 and QNI2 are preferably cut off in their OFF states. In the cut-off state, almost no current Ids flows as indicated by the point (g) shown in FIG. 3A.

When the transistors QNI1 and QNI2 are OFF, a current Ids smaller than the current Ids defining the threshold voltage may flow, as indicated by the point (h) shown in FIG. 3A. In this state, although a small current Ids flows, the transistors QNI1 and QNI2 are OFF in terms of circuit operation. Hence, the transistors QNI1 and QNI2 may take this OFF state. However, the leakage current increases in this OFF state, so that the transistors QNI1 and QNI2 are preferably cut off in their OFF states.

Further, when the drain potentials Vd of the transistors QPI3 and QPI2 are set to the negative potential VBB, and the substrate potential Vb is set to the power supply potential VCC, the gate potential Vg and source potential Vs take four combinations (1) to (4) in terms of circuit operation:

(1) Vg=VCC, Vs=VCC (2) Vg=VSS, Vs=VSS (3) Vg=VSS, Vs=VCC (4) Vg=VCC, Vs=VSS

Of combinations (1) to (4), the transistors QPI3 and QPI4 are turned on in combinations (1) to (3), and the transistors QPI3 and QPI4 are turned off in only combination (4).

In combinations (1) to (3), the transistors QPI3 and QPI4 may either be weakly or strongly inverted, similar to the transistors QNI1 and QNI2.

In combination (4), the transistors QPI3 and QPI4 are preferably cut off in their OFF states, similar to the transistors QNI1 and QNI2, in order to reduce the leakage current.

Figure 16:
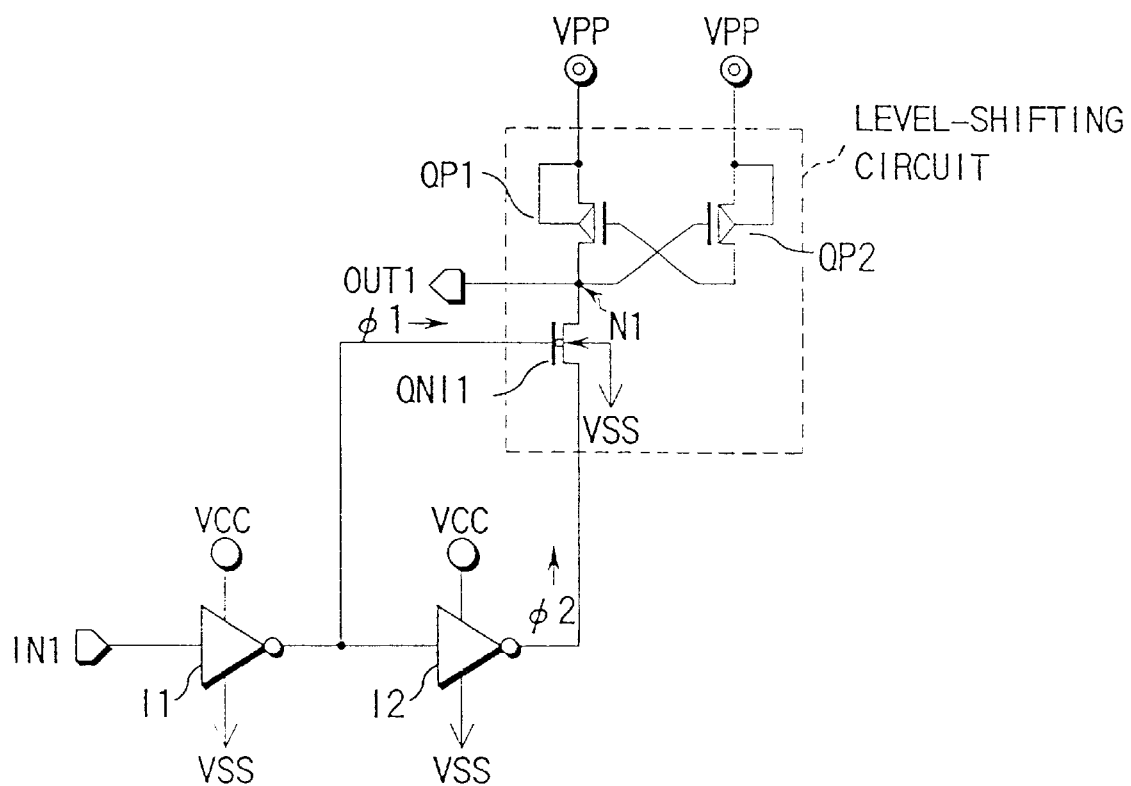
FIG. 16 is a circuit diagram showing a level-shifting circuit according to a modification of the first embodiment of the present invention.

As shown in FIG. 16, it is possible to employ only one of transistors QNI1 and QNI2. This modification is applicable to each of the embodiments described above.

The present invention can provide a semiconductor integrated circuit device having a level-shifting circuit capable of suppressing a decrease in switching speed even if the power supply voltage drops, and capable of operating even if the power supply voltage drops to a level near the threshold voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a first transistor of a first conductivity type having a source for receiving a first potential;
   a second transistor of the first conductivity type having a source for receiving the first potential, a gate connected to a drain of said first transistor, and a drain connected to a gate of said first transistor; and
   a third transistor of a second conductivity type having a drain for receiving a potential from the drain of said first transistor, a gate for receiving a first signal, and a source for receiving a second signal, wherein a threshold voltage of the third transistor is set to about 0V,
   wherein the first potential is positive to a potential of the first signal when the first signal is in a high level, the first conductivity type is p type, and the second conductivity type is n type, and
   wherein said third transistor is weakly or strongly inverted when a low-level potential of the first signal is applied to the gate, the source, and a substrate, and the first potential is input to the drain.

2. A semiconductor integrated circuit device comprising:
   a first transistor of a first conductivity type having a source for receiving a first potential;
   a second transistor of the first conductivity type having a source for receiving the first potential, a gate connected to a drain of said first transistor, and a drain connected to a gate of said first transistor; and
   a third transistor of a second conductivity type having a drain for receiving a potential from the drain of said first transistor, a gate for receiving a first signal, and a source for receiving a second signal, wherein a threshold voltage of the third transistor is set to about 0V,
   wherein the second signal is an inverted signal of the first signal,
   wherein the first potential is positive to a potential of the first signal when the first signal is in a high level, the first conductivity type is p type, and the second conductivity type is n type, and
   wherein said third transistor is weakly or strongly inverted when a low-level potential of the first signal is applied to the gate, the source, and a substrate, and the first potential is input to the drain.

3. The device according to claim 1, wherein said third transistor is weakly or strongly inverted when a high-level potential of the first signal is applied to the gate and the source, a low-level potential of the first signal is applied to the substrate, and the first potential is input to the drain.

4. The device according to claim 2, wherein said third transistor is weakly or strongly inverted when a high-level potential of the first signal is applied to the gate and the source, a low-level potential of the first signal is applied to the substrate, and the first potential is input to the drain.

5. A semiconductor integrated circuit device comprising:
   a first transistor of a first conductivity type having a source for receiving a first potential;
   a second transistor of the first conductivity type having a source for receiving the first potential, a gate connected to a drain of said first transistor, and a drain connected to a gate of said first transistor; and
   a third transistor of a second conductivity type having a drain for receiving a potential from the drain of said first transistor, a gate for receiving a first signal, and a source for receiving a second signal, wherein a threshold voltage of the third transistor is set to about 0V,
   wherein the first potential is negative to a potential of the first signal when the first signal is in a low level, the first conductivity type is n type, and the second conductivity type is p type, and
   wherein said third transistor is in a weakly inverted state or strongly inverted state when a high-level potential of the first signal is applied to the gate, the source, and a substrate, and the first potential is input to the drain.

6. A semiconductor integrated circuit device comprising:
   a first transistor of a first conductivity type having a source for receiving a first potential;
   a second transistor of the first conductivity type having a source for receiving the first potential, a gate connected to a drain of said first transistor, and a drain connected to a gate of said first transistor; and
   a third transistor of a second conductivity type having a drain for receiving a potential from the drain of said first transistor, a gate for receiving a first signal, and a source for receiving a second signal, wherein a threshold voltage of the third transistor is set to about 0V,
   wherein the second signal is an inverted signal of the first signal,
   wherein the first potential is negative to a potential of the first signal when the first signal is in a low level, the first conductivity type is n type, and the second conductivity type is p type, and
   wherein said third transistor is in a weakly inverted state or strongly inverted state when a high-level potential of the first signal is applied to the gate, the source, and a substrate, and the first potential is input to the drain.

7. The device according to claim 5, wherein said third transistor is in a weakly inverted state or strongly inverted state when a low-level potential of the first signal is applied to the gate and the source, a low-level potential of the first signal is applied to the substrate, and the first potential is input to the drain.

8. The device according to claim 6, wherein said third transistor is in a weakly inverted state or strongly inverted state when a low-level potential of the first signal is applied to the gate and the source, a low-level potential of the first signal is applied to the a substrate, and the first potential is input to the drain.

9. A semiconductor integrated circuit device comprising:
   a first transistor of a first conductivity type having a source for receiving a first potential;
   a second transistor of the first conductivity type having a source for receiving the first potential, a gate connected to a drain of said first transistor, and a drain connected to a gate of said first transistor; and
   a third transistor of a second conductivity type having a drain for receiving a potential from the drain of said first transistor, a gate for receiving a first signal, and a source for receiving a second signal, wherein a threshold voltage of the third transistor is set to about 0V,
   wherein a pulse width of the second signal during a period is greater than the pulse width of the first signal during the period.

10. A semiconductor integrated circuit device comprising:
    a first transistor of a first conductivity type having a source for receiving a first potential;
    a second transistor of the first conductivity type having a source for receiving the first potential, a gate connected to a drain of said first transistor, and a drain connected to a gate of said first transistor; and
    a third transistor of a second conductivity type having a drain for receiving a potential from the drain of said first transistor, a gate for receiving a first signal, and a source for receiving a second signal, wherein a threshold voltage of the third transistor is set to about 0V,
    wherein a pulse width of the first signal during a period is less than the pulse width of the second signal during the period.

11. A semiconductor integrated circuit device comprising:
    a first transistor of a first conductivity type having a source for receiving a first potential;
    a second transistor of the first conductivity type having a source for receiving the first potential, a gate connected to a drain of said first transistor, and a drain connected to a gate of said first transistor;
    a third transistor of a second conductivity type having a drain for receiving a potential from the drain of said first transistor, a gate for receiving a first signal, and a source for receiving a second signal, wherein a threshold voltage of the third transistor is set to about 0V, and
    a fourth transistor of the second conductivity type having a drain for receiving a potential from the drain of said second transistor, a gate for receiving a third signal having an inverted relationship with respect to the first signal, and a source for receiving a fourth signal having an inverted relationship with respect to the second signal.

12. A semiconductor integrated circuit device comprising:
    a first transistor of a first conductivity type having a source for receiving a first potential;
    a second transistor of the first conductivity type having a source for receiving the first potential, a gate connected to a drain of said first transistor, and a drain connected to a gate of said first transistor; and
    a third transistor of a second conductivity type having a drain for receiving a potential from the drain of said first transistor, a gate for receiving a first signal, and a source for receiving a second signal, wherein the first potential is positive to a potential of the first signal when the first signal is in a high level, the first conductivity type is p type, the second conductivity type is n type and the third transistor is formed on a p type semiconductor region which has a ground potential applied thereto,
    wherein said third transistor is weakly or strongly inverted when a low-level potential of the first signal is applied to the gate, the source, and a substrate, and the first potential is input to the drain.

13. The device according to claim 12, wherein said third transistor is weakly or strongly inverted when a high-level potential of the first signal is applied to the gate and the source, a low-level potential of the first signal is applied to the substrate, and the first potential is input to the drain.

14. A semiconductor integrated circuit device comprising:
    a first transistor of a first conductivity type having a source for receiving a first potential;
    a second transistor of the first conductivity type having a source for receiving the first potential, a gate connected to a drain of said first transistor, and a drain connected to a gate of said first transistor; and
    a third transistor of a second conductivity type having a drain for receiving a potential from the drain of said first transistor, a gate for receiving a first signal, and a source for receiving a second signal, wherein the first potential is negative to a potential of the first signal when the first signal is in a low level, the first conductivity type is n type, and the second conductivity type is p type, and the third transistor is formed on an n type semiconductor region which has a power supply potential applied thereto,
    wherein said third transistor is in a weakly inverted state or strongly inverted state when a high-level potential of the first signal is applied to the gate, the source, and a substrate, and the first potential is input to the drain.

15. The device according to claim 14, wherein said third transistor is in a weakly inverted state or strongly inverted state when a low-level potential of the first signal is applied to the gate and the source, a low-level potential of the first signal is applied to the substrate, and the first potential is input to the drain.

16. A semiconductor integrated circuit device comprising:
    a first transistor of a first conductivity type having a source for receiving a first potential;
    a second transistor of the first conductivity type having a source for receiving the first potential, a gate connected to a drain of said first transistor, and a drain connected to a gate of said first transistor; and
    a third transistor of a second conductivity type having a drain for receiving a potential from the drain of said first transistor, a gate for receiving a first signal, and a source for receiving a second signal, wherein the first potential is positive to a potential of the first signal when the first signal is in a high level, the first conductivity type is p type, the second conductivity type is n type and the third transistor is formed on a p type semiconductor region which has a ground potential applied thereto,
    wherein a pulse width of the second signal during a period is greater than the pulse width of the first signal during the period.

17. A semiconductor integrated circuit device comprising:
    a first transistor of a first conductivity type having a source for receiving a first potential;
    a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the first potential is positive to a potential of the first signal when the first signal is in a high level, the first conductivity type is p type, the second conductivity type is n type and the third transistor is formed on a p type semiconductor region which has a ground potential applied thereto, wherein a pulse width of the first signal during a period is less than the pulse width of the second signal during the period.

18. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor;

a third transistor of a second conductivity type having a drain for receiving a potential from the drain of said first transistor, a gate for receiving a first signal, and a source for receiving a second signal, wherein the first potential is positive to a potential of the first signal when the first signal is in a high level, the first conductivity type is p type, the second conductivity type is n type and the third transistor is formed on a p type semiconductor region which has a ground potential applied thereto; and a fourth transistor of the second conductivity type having a drain for receiving a potential from the drain of said second transistor, a gate for receiving a third signal having an inverted relationship with respect to the first signal, and a source for receiving a fourth signal having an inverted relationship with respect to the second signal.

19. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the first potential is negative to a potential of the first signal when the first signal is in a low level, the first conductivity type is n type, and the second conductivity type is p type, and the third transistor is formed on an n type semiconductor region which has a power supply potential applied thereto, wherein a pulse width of the second signal during a period is greater than the pulse width of the first signal during the period.

20. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the first potential is negative to a potential of the first signal when the first signal is in a low level, the first conductivity type is n type, and the second conductivity type is p type, and the third transistor is formed on an n type semiconductor region which has a power supply potential applied thereto, wherein a pulse width of the first signal during a period is less than the pulse width of the second signal during the period.

21. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor;

a third transistor of a second conductivity type having a drain for receiving a potential from the drain of said first transistor, a gate for receiving a first signal, and a source for receiving a second signal, wherein the first potential is negative to a potential of the first signal when the first signal is in a low level, the first conductivity type is n type, and the second conductivity type is p type, and the third transistor is formed on an n type semiconductor region which has a power supply potential applied thereto; and a fourth transistor of the second conductivity type having a drain for receiving a potential from the drain of said second transistor, a gate for receiving a third signal having an inverted relationship with respect to the first signal, and a source for receiving a fourth signal having an inverted relationship with respect to the second signal.

22. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the first potential is positive to a potential of the first signal when the first signal is in a high level, the first conductivity type is p type, and the second conductivity type is n type, and wherein said third transistor is weakly or strongly inverted when a low-level potential of the first signal is applied to the gate, the source, and a substrate, and the first potential is input to the drain.

23. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the second signal is an inverted signal of the first signal, wherein the first potential is positive to a potential of the first signal when the first signal is in a high level, the first conductivity type is p type, and the second conductivity type is n type, and wherein said third transistor is weakly or strongly inverted when a low-level potential of the first signal is applied to the gate, the source, and a substrate, and the first potential is input to the drain.

24. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the first potential is negative to a potential of the first signal when the first signal is in a low level, the first conductivity type is n type, and the second conductivity type is p type, and wherein said third transistor is in a weakly inverted state or strongly inverted state when a high-level potential of the first signal is applied to the gate, the source, and a substrate, and the first potential is input to the drain.

25. A semiconductor integrated circuit device comprising:

a first transistor of a first conductivity type having a source for receiving a first potential;

a second transistor of the first conductivity type having a source for receiving the first potential, a gate connected to a drain of said first transistor, and a drain connected to a gate of said first transistor; and a third transistor of a second conductivity type having a drain for receiving a potential from the drain of said first transistor, a gate for receiving a first signal, and a source for receiving a second signal, wherein the second signal is an inverted signal of the first signal, wherein the first potential is negative to a potential of the first signal when the first signal is in a low level, the first conductivity type is n type, and the second conductivity type is p type, and wherein said third transistor is in a weakly inverted state or strongly inverted state when a high-level potential of the first signal is applied to the gate, the source, and a substrate, and the first potential is input to the drain.

26. The device according to claim 22, wherein said third transistor is weakly or strongly inverted when a high-level potential of the first signal is applied to the gate and the source, a low-level potential of the first signal is applied to the substrate, and the first potential is input to the drain.

27. The device according to claim 23, wherein said third transistor is weakly or strongly inverted when a high-level potential of the first signal is applied to the gate and the source, a low-level potential of the first signal is applied to the substrate, and the first potential is input to the drain.

28. The device according to claim 24, wherein said third transistor is in a weakly inverted state or strongly inverted state when a low-level potential of the first signal is applied to the gate and the source, a low-level potential of the first signal is applied to the substrate, and the first potential is input to the drain.

29. The device according to claim 25, wherein said third transistor is in a weakly inverted state or strongly inverted state when a low-level potential of the first signal is applied to the gate and the source, a low-level potential of the first signal is applied to the substrate, and the first potential is input to the drain.

* * * * *